United States Patent
Takekuma et al.

(10) Patent No.: US 6,172,517 B1
(45) Date of Patent: *Jan. 9, 2001

(54) SIGNAL TRANSMITTING DEVICE, CIRCUIT BLOCK AND INTEGRATED CIRCUIT SUITED TO FAST SIGNAL TRANSMISSION

(75) Inventors: Toshitsugu Takekuma, Ebina; Ryoichi Kurihara; Akira Yamagiwa, both of Hadano, all of (JP)

(73) Assignee: Hitachi, Ltd., Tokyo (JP)

( * ) Notice: Under 35 U.S.C. 154(b), the term of this patent shall be extended for 0 days.

This patent is subject to a terminal disclaimer.

(21) Appl. No.: 09/084,017

(22) Filed: May 26, 1998

Related U.S. Application Data

(63) Continuation of application No. 08/773,753, filed on Dec. 24, 1996, now Pat. No. 5,818,253, which is a continuation of application No. 08/476,576, filed on Jun. 7, 1995, now Pat. No. 5,568,063, which is a continuation of application No. 08/269,352, filed on Jun. 30, 1994, now Pat. No. 5,548,226.

(30) Foreign Application Priority Data

Dec. 28, 1993 (JP) .................................. 5-334631

(51) Int. Cl.⁷ ...................... H03K 17/16; H03K 19/0175
(52) U.S. Cl. ............................................... 326/30; 326/86
(58) Field of Search ........................................ 326/30, 86

(56) References Cited

U.S. PATENT DOCUMENTS

| | | | |
|---|---|---|---|
| 3,694,665 | 9/1972 | Belluche | 326/30 |
| 3,710,282 | 1/1973 | Seinecke . | |
| 3,832,575 | 8/1974 | Dasgupta et al. | 326/30 |
| 4,922,449 | 5/1990 | Donaldson et al. . | |
| 4,987,318 | 1/1991 | Burke et al. | 326/30 |
| 5,003,467 | 3/1991 | Donaldson et al. | 326/30 |
| 5,019,728 | 5/1991 | Sanwo et al. | 326/30 |
| 5,046,072 | 9/1991 | Shimizu et al. | 326/30 |
| 5,105,340 | 4/1992 | Lawrence | 361/782 |
| 5,227,677 | 7/1993 | Furman | 326/30 |
| 5,568,063 | * 10/1996 | Takekuma et al. | 326/30 |

FOREIGN PATENT DOCUMENTS

| | | |
|---|---|---|
| 2023503 | 3/1970 | (DE) . |
| 57-120147 | 7/1982 | (JP) . |
| 4-98932 | * 3/1992 | (JP) . |
| 4-249945 | * 9/1992 | (JP) . |
| 5-129924 | * 5/1993 | (JP) . |
| 5-259942 | * 10/1993 | (JP) . |

OTHER PUBLICATIONS

Nikkei Electronics, No. 556, Jun. 8, 1992, pp. 133–140.*
"New I/O Proposal", Fujitsu, JEDEC JC16, San Diego, Dec. 5, 1993, pp. 1–12.
Nikkei Electronics, Nov. 27, 1993, pp. 269–290.

* cited by examiner

*Primary Examiner*—Michael Tokar
*Assistant Examiner*—Richard Roseen
(74) *Attorney, Agent, or Firm*—Antonelli, Terry, Stout & Kraus, LLP

(57) ABSTRACT

A signal transmitting circuit includes one or more circuit blocks having a driving circuit and an intra-block transmission line for transmitting a signal produced by the driving circuit, one or more circuit blocks having a receiving circuit and an intra-block transmission line for transmitting the signal to said receiving circuit, and a main interblock transmission line for propagating a signal between both of the driving and receiving circuit blocks. Inter-block transmission line is terminated at one or two ends by one or two resistors having substantially the same impedance as the interblock transmission line itself. Each of the intra-block transmission line is provided with a resistance element having a resistance equal to or close to a value derived by subtracting a half of an impedance of the inter-block transmission line from an impedance of the intra-block transmission line, to lower signal amplitude and suppress reflections of a signal at branch points along the main interblock transmission line, thereby enabling a high-speed signal transfer.

7 Claims, 25 Drawing Sheets

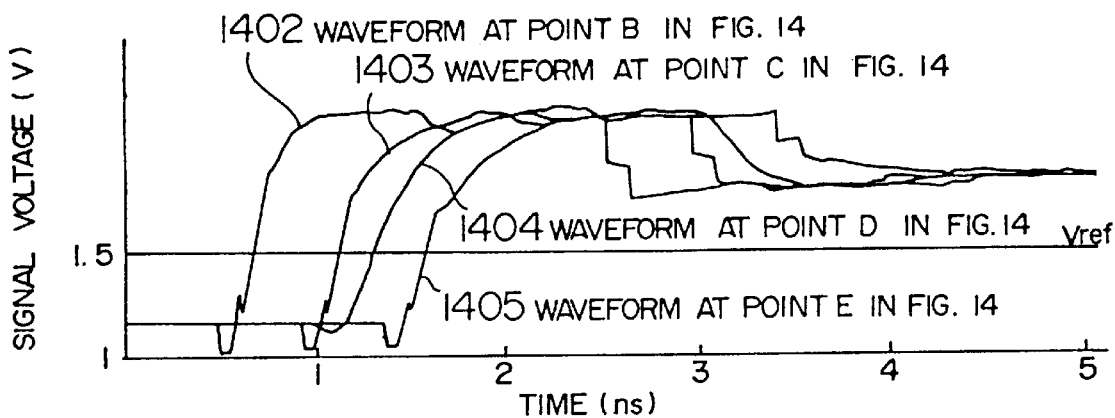
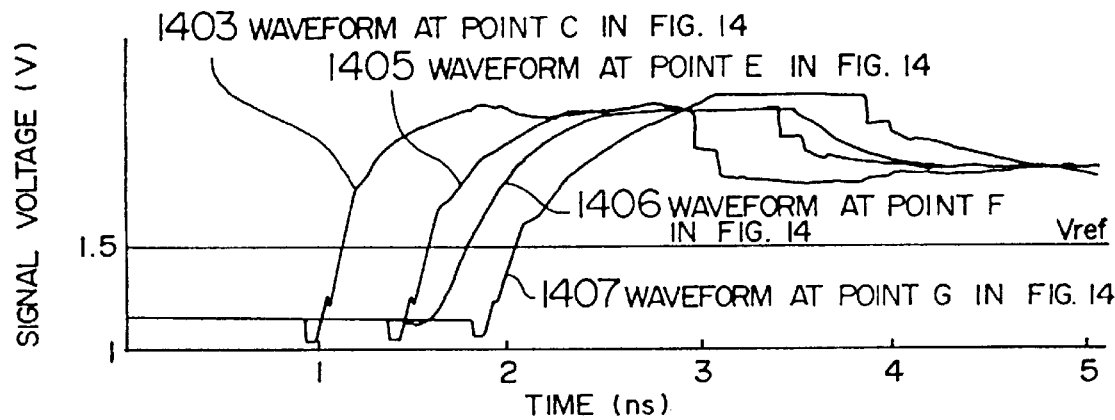
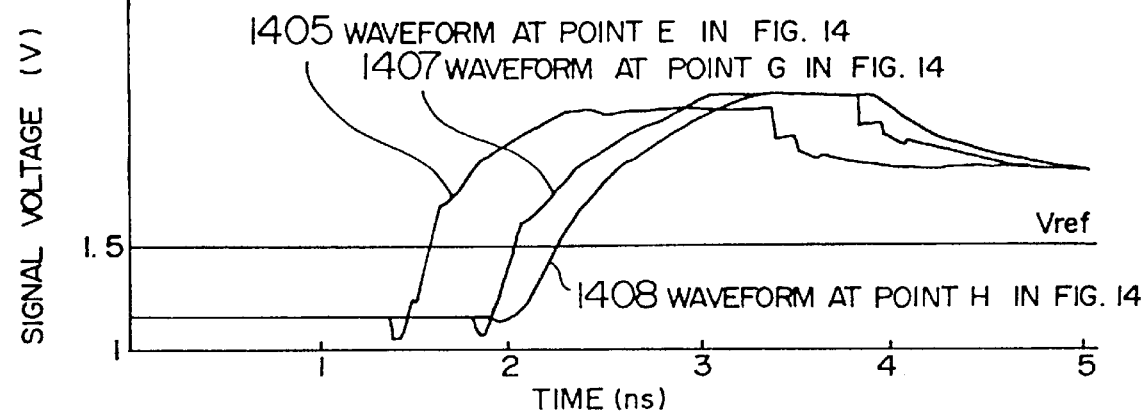

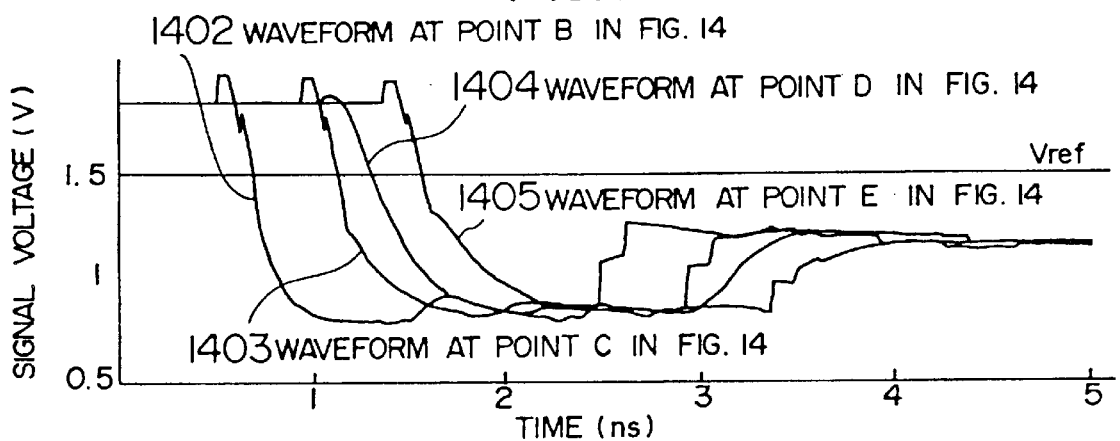
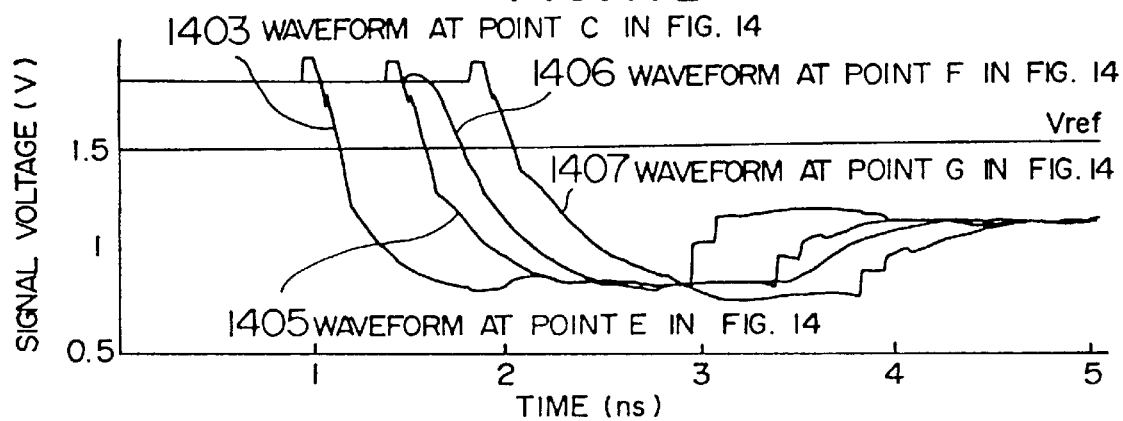
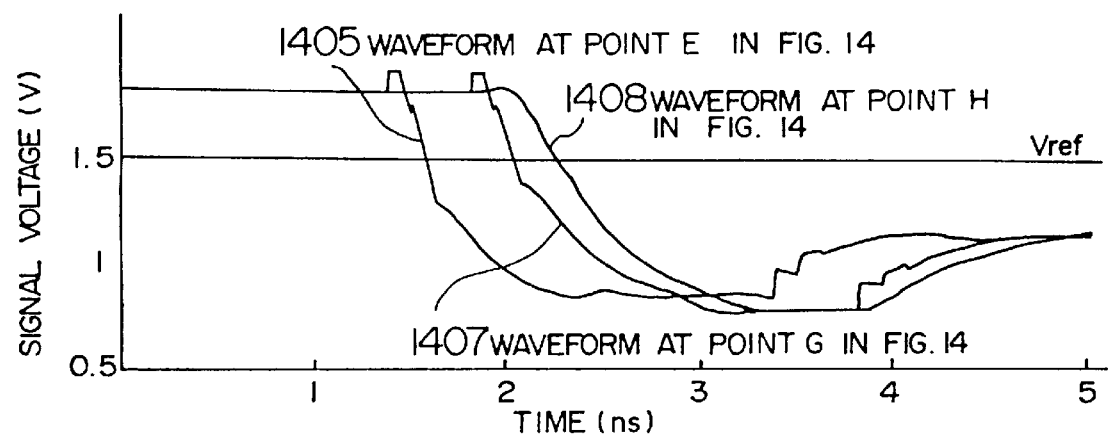

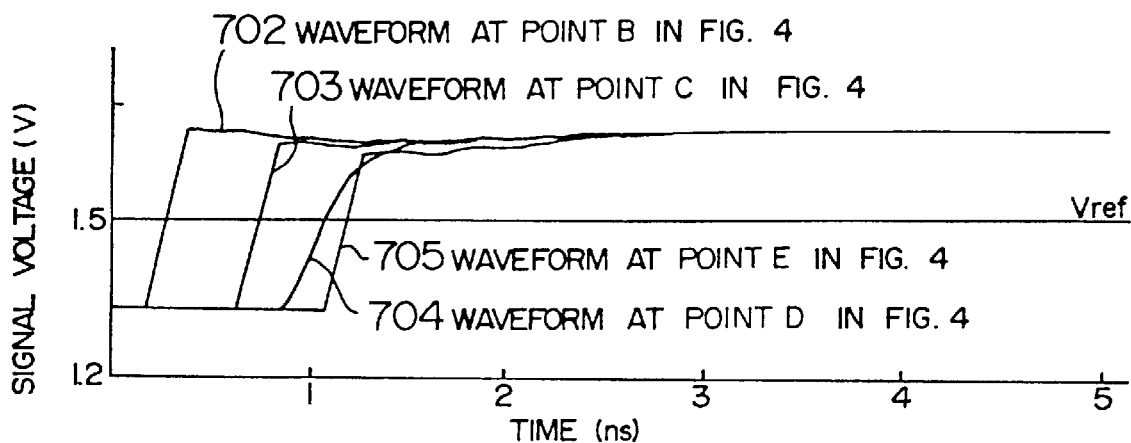
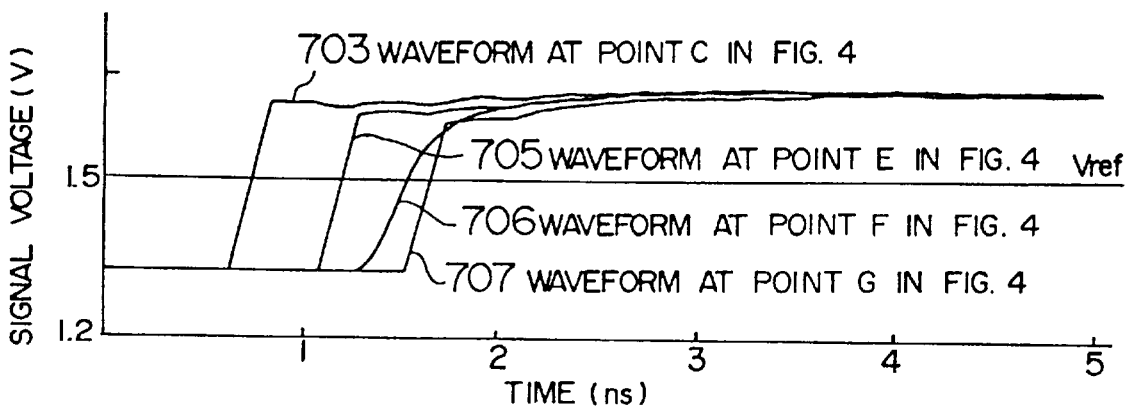
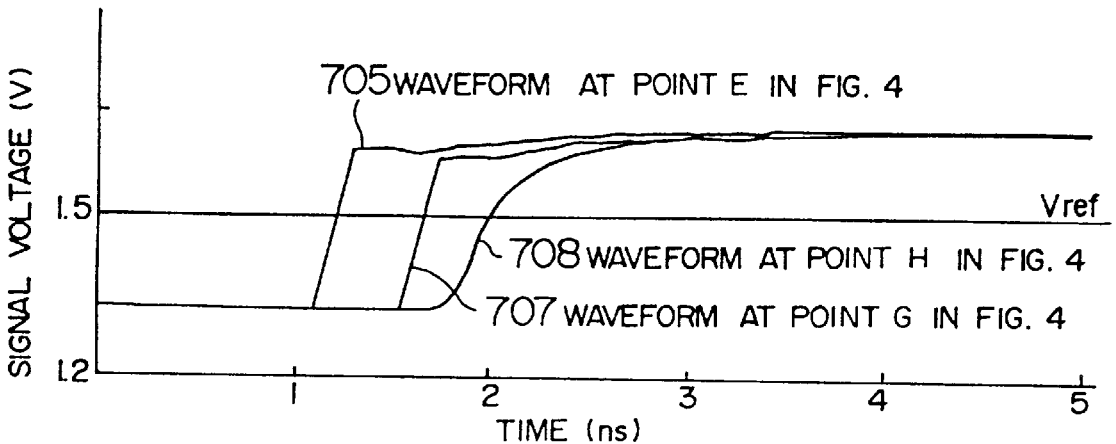

SIGNAL TRANSMITTING DEVICE, CIRCUIT BLOCK AND INTEGRATED CIRCUIT SUITED TO FAST SIGNAL TRANSMISSION

CROSS-REFERENCE TO RELATED APPLICATIONS

This application is a continuation of application Ser. No. 08/773,753, filed Dec. 24, 1996 now U.S. Pat. No. 5,818,253; which is a continuation of application Ser. No. 08/476,576 filed Jun. 7, 1995 (now U.S. Pat. No. 5,568,063); which is a continuation of application Ser. No. 08/269,352 filed Jun. 30, 1994 (now U.S. Pat. No. 5,548,226), the disclosures of which are hereby incorporated by reference.

BACKGROUND OF THE INVENTION

The present invention relates to technique of transmitting a signal between elements such as a CPU and a memory device or memory IC (for example, between digital circuits each composed of CMOS elements or functional blocks of CMOS elements), and, more particularly to techniques of quickly transmitting a signal through one bus in which one main transmission line has plural elements connected thereto.

As a technique of quickly transmitting a signal between digital circuits each composed of a semiconductor integrated circuit, there has been proposed a technique of a low-amplitude interface for propagating a signal having a signal amplitude as low as about 1 volt.

As a representative example of such a low-amplitude interface, a GTL (Gunning Transceiver Logic) interface or a CTT (Center Tapped Termination) interface has been heretofore proposed. These low-amplitude interfaces are discussed in detail in pp 269 to 290 of Nikkei Electronics, Nov. 27, 1993.

FIG. 1 shows a prior art arrangement of such a low-amplitude interface in which one main transmission line has plural branched lines.

A numeral 100 denotes a transmission line terminated by termination power supplies 60 and 61 and termination resistors 50 and 51. The transmission line 100 is connected to a driving circuit block 1 and receiving circuit blocks 2, 3 and 4.

The transmission line 100 has an impedance of 50Ω. Each of branched lines 11 to 14 has an impedance of 50Ω. Each of the terminating resistors 50 and 51 has an impedance of 50Ω. Each voltage of the terminating power supplies 60 and 61 is 0.5 volt. The sending or driving circuit 21 has an on resistance of 10Ω.

When the driving circuit 21 is at a logical "High" output, the circuit 21 operates to connect the transmission line 11 to a 1-volt power supply (not shown). When the driving circuit 21 is at a logical "Low" output, the circuit 21 operates to connect the transmission line 11 to the ground, that is, a 0-volt power supply (not shown). Numerals 32 to 34 denote receiving circuits included in a receiving circuit block, respectively. These receiving circuits compare received signals with the reference voltage $V_{ref}$ to determine if the received signal is a Low or High level. In this arrangement, $V_{ref}$ is set at 0.5V.

Next, a description will be given as to how a signal is transmitted to each point in FIG. 1 on this bus when the driving circuit 21 is switched from the Low output to the High output. At first, a potential of the transmission bus 100 is derived when the driving circuit 21 is at the Low output. The voltage at the point A on the transmission line at this time corresponds to a voltage given by dividing the terminating power source of 0.5 volt by the terminating resistances 50 and 51 and the on resistance of the sending circuit 21. That is, the voltage is derived by:

$$0.5V \times 10Ω/(10Ω+50Ω/2)=0.14(V)$$

Next, the potential will be derived of the transmission line which occurs when the output of the sending circuit 21 is switched from the Low output to the High output so that a signal is transmitted to a point A of FIG. 1 as follows. Immediately after the output of the sending circuit 21 is switched, the power supply voltage is divided by the on-resistance of the sending circuit and the impedance 50Ω of the transmission line 11. Hence, the potential boost at the point A is derived by:

$$1V \times 50Ω/(50Ω+10Ω)=0.83 \text{ (V)}$$

The addition of the initial voltage 0.14 V and the voltage boost, that is, 0.97 V corresponds to the potential at the point A.

The potential occurring when the waveform of the amplitude of 0.83 V reaches the branch point B is derived as follows. If the transmission line 100 is viewed from the transmission line 11, since the transmission line 100 is divided into two, left and right parts, the virtual impedance of the transmission line 100 if viewed from the transmission line 11 becomes a half of an impedance 50Ω of the transmission line 100, that is, 25Ω. On the other hand, since the impedance of the transmission line 11 is 50Ω, the mismatch of the impedance results in bringing about the reflection of a signal at the point B.

The reflective coefficient is derived as follows.

$$(50Ω-25Ω)/(50Ω+25Ω)=0.33$$

This means that a one-third part of the signal amplitude of 0.83 V transmitted to the point A, that is, a signal of the amplitude 0.28 V is reflected and returned to the sending circuit side. The signal of the left amplitude 0.55 V is transmitted to the transmission line 100 as a first transmitted wave. Hence, the potential of the transmitted signal corresponds to an addition of 0.55 V and the initial potential, that is, 0.69 V.

When the signal having the amplitude of 0.28 V returned to the sending circuit reaches the sending circuit, the signal is mirror-reflected and reaches the point B again. A two-third part of the signal passes through the transmission line 100, while the remaining one-third part of the signal is returned to the transmission line 11. According to such an action, the signal travels to and fro on the transmission line 11 again and again. Each time the signal waveform reaches the point B, the two-third part of each waveform is output to the transmission line 100. By this operation, the amplitude of 0.83 V originally at the point A is dividedly transmitted to the transmission line 100 bit by bit.

The signal of 0.69 V which passed through the point B and transmitted to the transmission line 100 reaches the point C. At this point, two transmission lines are each made to have an impedance of 50Ω before the passage of the signal. Hence, the mismatch of the forward synthesized impedance 25Ω to the impedance of 50Ω of the transmission line on which the signal has passed results in bringing about the reflection of the signal.

The reflective coefficient is as follows:

$$(50Ω-25Ω)/(50Ω+25Ω)=0.33$$

The potential of the waveform passed through the point C corresponds to a potential derived by multiplying the signal amplitude of 0.55 V at the point B by a transmittance $\frac{2}{3}$ ($=1-\frac{1}{3}$) and adding the initial potential to the multiplied value. That is, $$0.55V \times \frac{2}{3} + 0.14V = 0.50 \text{ (V)}$$

A similar reflection takes place at the point E or the point G. The potential at the point E is 0.38 V and the potential at the point G is 0.30 V.

These results are shown in FIGS. 2A to 2C. FIG. 2A shows signals which come to and go out of the point C, that is, a signal of the point B coming to the point C and signals of the point D and the point E going out of the point C. For explaining them clearly, the signal at the point A is shown as well. Likewise, FIG. 2B shows signals which come to and go out of the point E. FIG. 2C shows signals which come to and go out of the point G. In FIGS. 2A to 2C, a numeral 201 denotes a signal waveform at the point A in FIG. 1. A numeral 202 denotes a waveform at the point B. A numeral 203 denotes a waveform at the point C. A numeral 204 denotes a waveform at the point D. A numeral 205 denotes a waveform at the point E. A numeral 206 denotes a waveform at the point F. A numeral 207 denotes a waveform at the point G. A numeral 208 denotes a waveform at the point H. When the signal drops, the same thing takes place. The signal waveforms at the drop of the signal are as shown in FIGS. 3A to 3C. In FIG. 3, numerals 201 to 208 denote signal waveforms at the point A to the point H shown in FIG. 1, respectively.

From the situation described above, it is understood that the use of the conventional signal transmitting circuit makes it impossible to allow the first signal at the point A indicating a High level from the driving circuit 21 to exceed the reference voltage Vref (0.5 V in the above condition) at all of the receiving circuit blocks for establishing that the signal is at the High level. In other words, due to the large degree of reflection at the various points B, C, E and G, the original High level voltage at the point A for the first signal is attenuated to very low levels of voltage that will not exceed the reference voltage $V_{ref}$ at the receivers. Therefore, even though the sending circuit 21 is indicating a High level, the receivers 32, 33 and 34 will not be able to recognize this for the first signal. Eventually, after repeated signals, the level of voltage at points B, C and D will increase to levels much closer to the level at point A, but, until this occurs, the receivers will not be able to recognize the High level.

The signal entering each branched line at the branch point C, E or G, like the transmission line 11, is reflected over and over inside of the branched line. When the reflected waveform returns to the branch point, the two-third part of the signal goes to the transmission line 100. This brings about a waveform distortion on the transmission line 100.

As mentioned above, in the foregoing prior art, the reflections take place at each branch point. The potential drops resulting from the reflections are overlapped with each other. Hence, the rise of the signal potential is delayed in a remote place of the driving circuit. This results in disadvantageously increasing the delay time, and thereby prevents quickly transmitting the signal.

Further, the signal entered into the receiving circuit block is reflected in the receiving circuit part and then goes into the transmission line 100. This also results in disadvantageously distorting the signal waveform, thereby lowering the reliability of the signal transmission.

To speed up the signal transmission and make the signal amplitude on the line 100 smaller, the above prior art is arranged so that the supply voltage is 1 V. In the circuit discussed in the aforementioned paper, to achieve an amplitude of 1 V at the normally used power supply of 3.3 V, the driving circuit is arranged to give a special value of 100Ω to its on-resistance for realizing a small amplitude.

The special value given to the on resistance as mentioned in the paper, however, makes the widely available transistors having an on resistance of about 10 W useless. In other words, specially designed transistors are required.

Further, such a higher on resistance given to the sending circuit 21 leads to increasing the power consumption of the driving circuit, thereby disadvantageously increasing the overall power consumption.

As another known prior art arrangement relevant to the present invention, U.S. Pat. No. 4,922,449 to Donaldson et al may be referred to. This U.S. Patent discloses a technique of providing a resistor between a circuit block and an inter-block signal transmission line in a circuit line structure having plural circuit blocks containing a driving circuit and a receiving circuit and the inter-block signal transmission line for propagating a signal between the circuit blocks. The object of providing the resistor therebetween is for reducing passage current appearing at the time of signal collision by the source switching operation, that is, reducing the amplitude of the signal on the inter-block signal transmission bus. The resistance is set as 20 W to 40 W. This resistance may bring about a signal reflection at a branch point between the transmission line inside of the circuit block and the inter-block transmission line. The signal reflection may disadvantageously inhibit the realization of fast signal transmission. That is, this technique does not define any resistance based on a relation of an impedance between the inter-block signal transmission line and the signal transmission line inside of the block.

Moreover, another prior art arrangement which provides a resistor between an inter-block signal transmission line and a signal transmission line inside of the circuit block is disclosed in JP-B-54-5929. In this prior art arrangement, a resistor is provided only between the circuit block on the side of the receiving circuit and the inter-block signal transmission line, but no resistor is provided between the circuit block provided with a sending circuit and the inter-block signal transmission bus. Like U.S. Pat. No. 4,922,449, a signal reflection takes place when the signal outputted from the sending circuit is transmitted onto the inter-block signal transmission bus. As in the previously described arrangement, this signal reflection may disadvantageously inhibit realization of fast signal transmission.

SUMMARY OF THE INVENTION

It is an object of the present invention to provide a signal transmitting device, a circuit block, and an integrated circuit which are arranged to overcome the foregoing disadvantages, suppress the drop of a signal potential on a transmission line having branched lines, prevent repetitive reflections in each branched line, and keep an amplitude of a signal small on the line, for quickly transmitting a signal.

To achieve the object in a preferred mode, a signal transmitting device comprises a first circuit block including a driving circuit for driving a signal and an intra-block transmission line for transmitting a signal from the driving circuit to the outside of the circuit block, a second circuit block including a receiving circuit for receiving a signal and an intra-block transmission line for transmitting a signal to be inputted to the receiving circuit, and an inter-block transmission line for transmitting the signal between the circuit blocks, wherein the inter-block transmission line is terminated by one or two elements each having a resistance equal to or close to a characteristic impedance value of the inter-block transmission line. In addition, the resistance of each of resistors 80 to 83 is provided with a resistance equal to or close to a value obtained by subtracting a half of the impedance of the inter-block transmission line from the impedance of the intra-block transmission line.

In a circuit device having plural blocks each having both of a driving circuit and a receiving circuit, likewise, the inter-block transmission line is terminated by one or two elements each having a resistance equal to or close to a characteristic impedance of the inter-block transmission line. Each intra-block transmission line is provided to have a resistance equal to or close to a value obtained by subtracting a half of the characteristic impedance of the inter-block transmission line from the impedance of the intra-block transmission line.

In the case where a package with a long lead frame such as quad flat package (QFP) or a pin grid array (PGA) is used in an integrated circuit having a driving or a receiving circuit integrated thereon termination is made to the inter-block transmission line, a resistor is provided for impedance matching between the inter-block transmission line and the intra-block transmission line, and the impedance of the lead frame and the impedance of the intra-block transmission line are matched.

In accordance with the present invention, by inserting a resistor having a resistance close to a value derived by reducing a half of an impedance of the line from the impedance of the branched line, it is possible to prevent repetition of reflections inside of the branched line and attenuate the amplitude of the transmission line by dividing the inserted resistance and the terminating resistance, thereby enabling to quickly transmit the signal.

In the case where a large number of branch points exist on the inter-block transfer line, the capacitance because of the existence of the resistors, the inter-block transmission line is not able to see the branched line directly (i.e., the total of the transmission line load capacitance and the capacitance of the driving and receiving circuits). This is effective in suppressing the line impedance from being lowered. Further, the waveform distortion due to live-insertion can be suppressed.

BRIEF DESCRIPTION OF THE DRAWINGS

FIGS. 16A to 16C are graphs showing signal waveforms (leading waveforms) occurring in the case of the circuit according to the embodiment 3 of the present invention;

FIGS. 17A to 17C are graphs showing signal waveforms (tailing waveforms) occurring in the case of the circuit according to the embodiment 3 of the present invention;

FIGS. 18A to 18C are graphs showing signal waveforms (leading waveforms) occurring in the case of changing an impedance on a transmission line in the circuit according to the embodiment 1 of the present invention;

DESCRIPTION OF THE PREFERRED EMBODIMENTS

Embodiment of the present invention will be described in detail with reference to the accompanying drawings.

Figure 1:
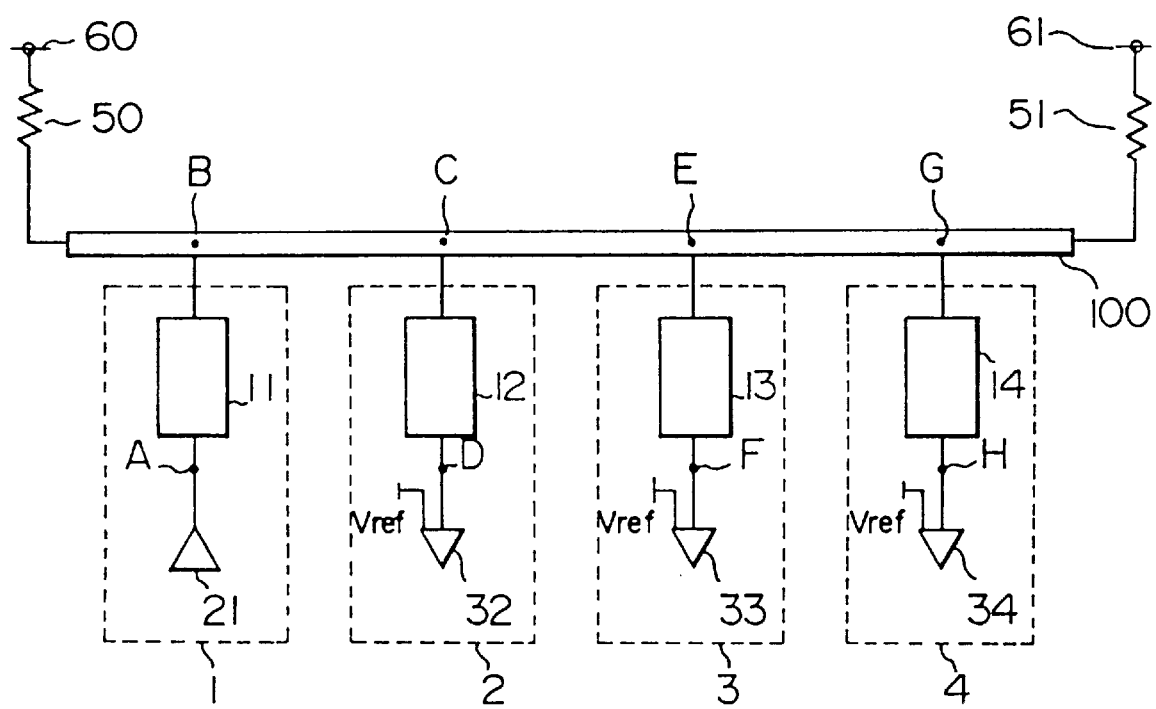
FIG. 1 is a diagram showing a conventional unidirectional transmission line.
Figure 2A:
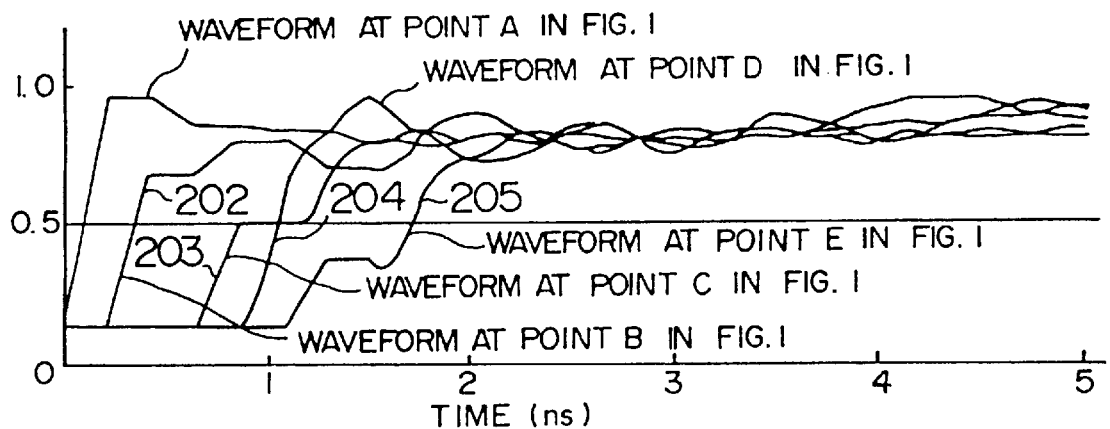
FIGS. 2A to 2C are charts showing signal waveforms (leading waveforms) appearing in the case of using the conventional transmission line.
Figure 2B:
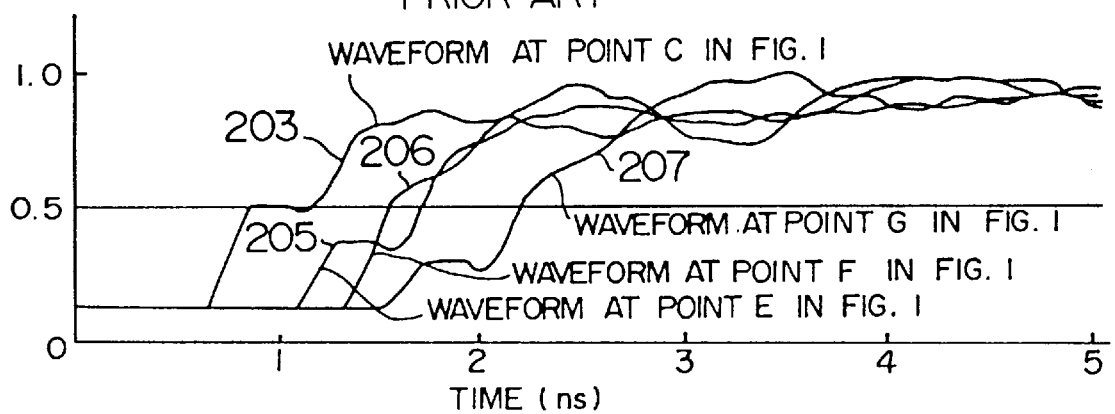
Figure 2C:
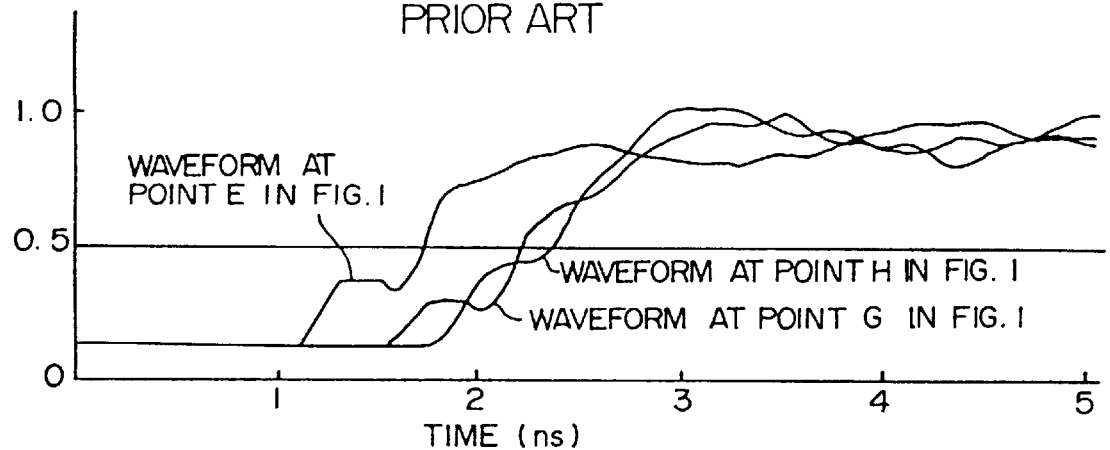
Figure 3A:
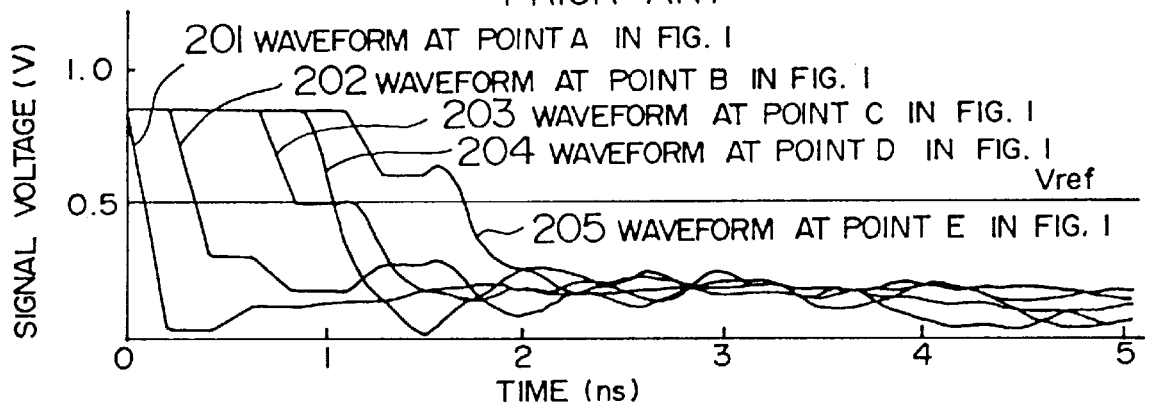
FIGS. 3A to 3C are charts showing signal waveforms (tailing waveforms) appearing in the case of using the conventional transmission line.
Figure 3B:
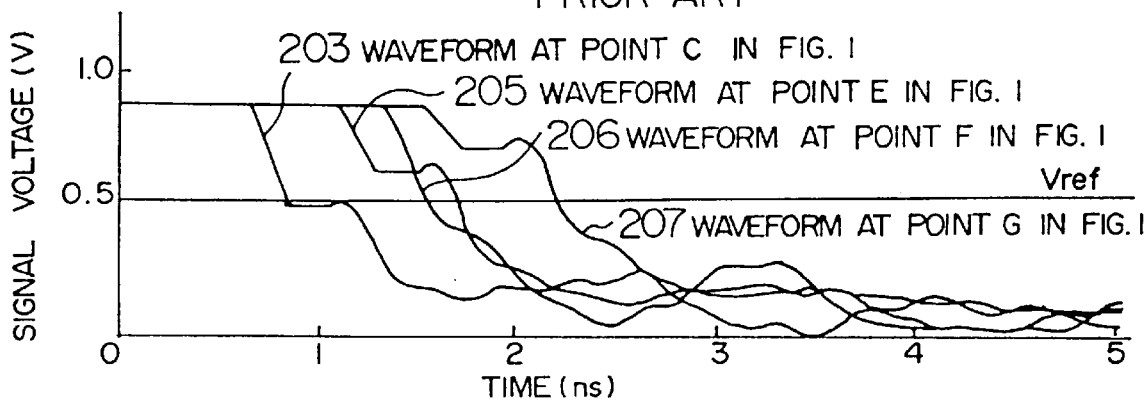
Figure 3C:
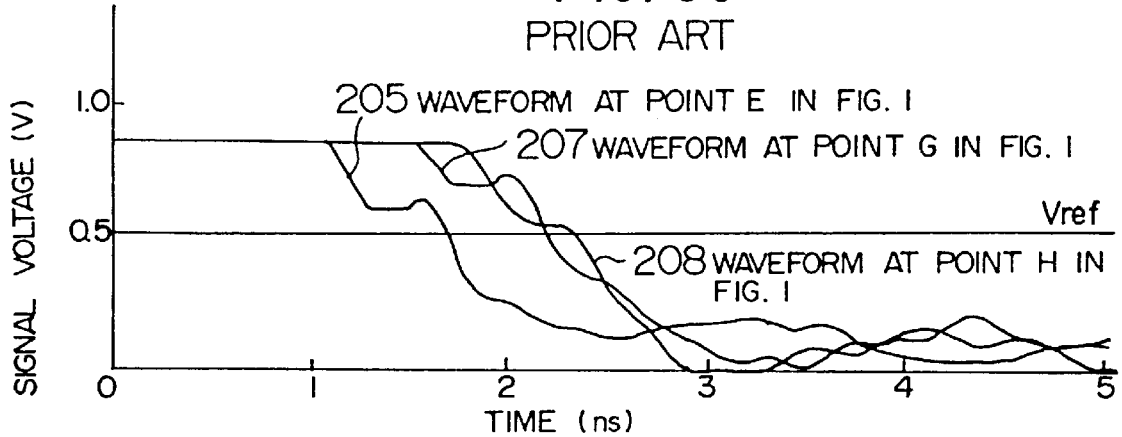
Figure 4:
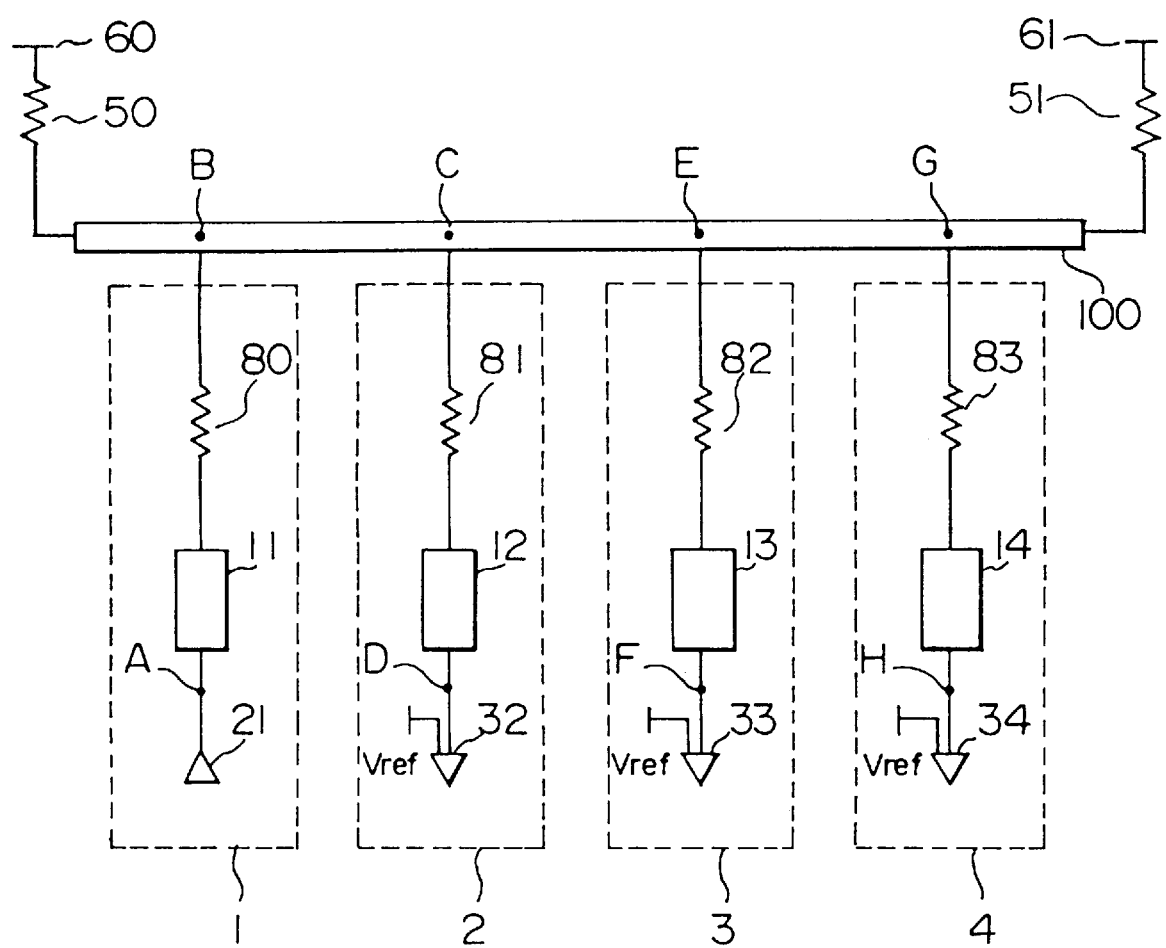
FIG. 4 is a block diagram showing an embodiment 1 of the present invention.

FIG. 4 shows in fundamental block diagram, a first embodiment of a unidirectional transmission line to which the present invention is applied.

In FIG. 4, a numeral 1 denotes a driving circuit block (unit) having a driving circuit 21. Numerals 2 to 4 denote receiving circuit blocks provided with receiving circuits 32 to 34, respectively. The circuit blocks include resistors 80 to 83 and transmission lines 11 to 14, respectively. A transmission line 100 is connected to the circuit blocks 1 to 4, and both ends of the transmission bus 100 are terminated by the resistors 50 and 51, each having a resistance equal to or close to a characteristic impedance value of the transmission line 100.

In FIG. 4, the transmission line 100 has an impedance of 50Ω. The branched lines 11 to 14 each have an impedance of 100Ω. Each of the termination resistors 50 and 51 has a resistance of 50Ω. Terminating power supplies 60 and 61 operate to supply a voltage of 1.5 V. The driving circuit 21 has an on resistance of 10Ω.

The driving circuit 21 operates to connect a transmission line to a 3V-power supply (such as 62 in FIG. 5) when the driving circuit 21 holds the output high or connect the transmission line to a ground potential (such as 63, in FIG. 5) when the driving circuit 21 holds the output low. In FIG. 4, numerals 32 to 34 denote receiving circuits.

The resistors 80 to 83 are each defined to have a resistance of 75Ω. The method of defining the resistance will be described later.

It is noted that in this embodiment, the transmission line 100 is terminated at both of the ends. However, it may be terminated at one end by just one resistor, if preferred. Further, this embodiment provides three receiving circuit blocks each having a receiving circuit. However, the present invention is applicable to a signal transmission device including at least one block having the receiving circuit.

Figure 5:
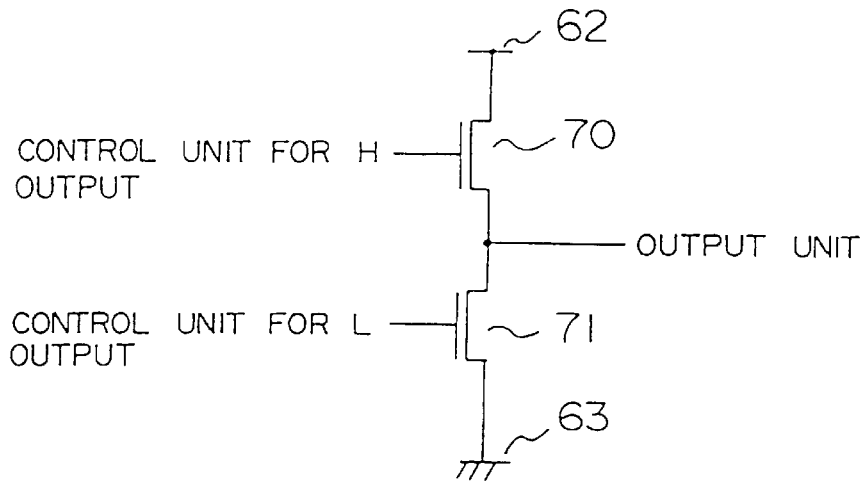
FIG. 5 is a circuit diagram showing an example of a driving circuit.

FIG. 5 shows an example of the sending or driving circuit 21 used in the arrangement of FIG. 4. This driving circuit 21 is a push-pull driving circuit composed of a pull-up transistor 70 and a pull-down transistor 71.

The pull-up transistor 70 shown in FIG. 5 is made of an N-channel MOS field-effect transistor (NMOS). The material of the transistor 70 is not limited to NMOS. For example, a P-channel MOS field-effect transistor (PMOS) may be used for making the transistor 70.

A low-amplitude driving circuit provided with the push-pull driving circuit is discussed in detail in the Nikkei Electronics paper referred to previously as a prior art arrangement. In this paper, however, the driving circuit uses a transistor with as high an on-resistor as about 100Ω. On the contrary, the present invention uses a transistor with an on resistance of about 10Ω which is now widely available. The present invention may use the conventional driving circuit, because the sum of on-resistance of the resistors 80 to 83 added in this embodiment and the transistor on resistance of about 10Ω is close to the on resistance of 100Ω of the prior art device so that the amplitude on the transmission bus 100 is approximately the same magnitude as that of the prior art.

For example, assume that the impedance and the termination resistor of the transmission line 100 is 50Ω, the impedance of the branched line is 100Ω, the terminating power supply feeds a voltage of 1.5 V, and the power supply for the driving circuit feeds a voltage of 3 V. With these assumptions, the signal amplitude becomes 0.6 V on the transmission line used in the foregoing paper indicating the use of the transistor with the on resistance of 100Ω, and the amplitude is substantially equal to the amplitude of 0.68 V of the transmission line 100 shown in FIG. 4.

By lowering the on-resistance of the driving circuit 21 from 100Ω to 10Ω, it is possible to reduce the power consumed in the driving circuit. For example, in the above condition, the prior art device arranged to use an on resistance of 100Ω consumes a power of 14.4 mW, while the present invention may greatly reduce the power consumption down to 1.9 mW. Moreover, the present embodiment may use a driving circuit having an on-resistance of 10Ω or more, concretely, about 50Ω. Such a driving circuit may offer the same effect as above.

Figure 6:
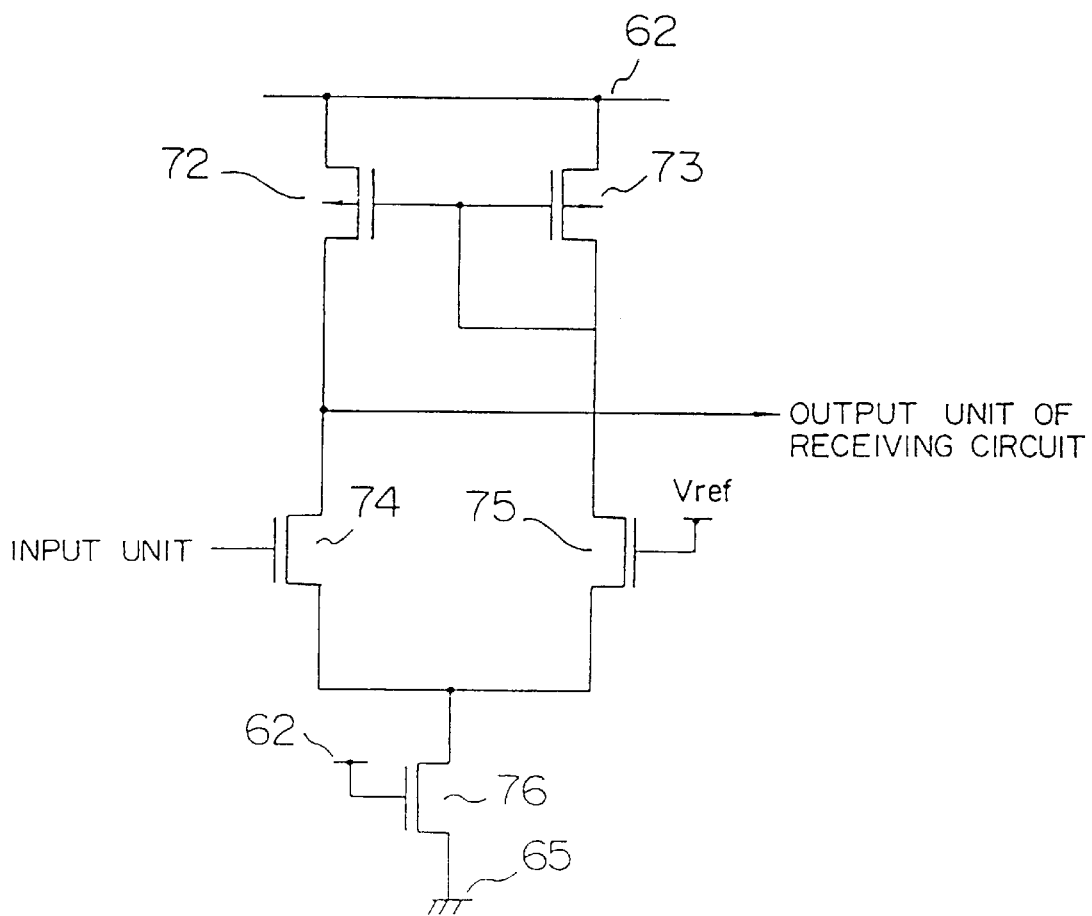
FIG. 6 is a circuit diagram showing an example of a differential receiving circuit.

Next, an example of the receiving circuits of FIG. 4 is shown in FIG. 6. This receiving circuit is a differential receiving circuit for determining if an input signal is logically High or Low based on whether or not an input voltage is higher or lower than the reference voltage $V_{ref}$. The reference voltage used herein may be produced inside of an integrated circuit. However, if noises appearing inside of the integrated circuit or noises which have entered from the outside cause the power supply to fluctuate, the reference voltage may fluctuate accordingly. Hence, it is better to feed the reference voltage from the outside. Further, it is preferable that the receiving circuit is an NMOS type differential receiving circuit for receiving an input signal through the effect of the NMOS. If this type receiving circuit is used as the reference voltage, the voltage of the terminating power supply is used. In this case, the reference voltage is equal to half of a supply voltage. Hence, it is possible to receive a small amplitude waveform of 1 V or less around the reference voltage.

For example, under the following condition, the amplitude at receiving circuit is 0.68V. Specifically, if each of the resistances of terminating resistors 50, 51 is 50 ohms, each of the resistances of matching resistors 80, 81, 82 and 83 is 75 ohms and the on-resistance of driving circuit is 10 ohms, the supply voltage for the driving circuit is 3V, and the terminating supply voltage is 1.5V, when the driving circuit is at a low output, the voltage at each receiving circuit is 1.16V (=1.5V−(1.5V−0)×(50Ω/2)/(50Ω/2+75Ω+10)=1.5−0.34) and when the driving circuit is at a high output, the voltage at each receiving circuit is 1.84V (=1.5V+(3−1.5)×(50/2)/(50/2+75+10)=1.5+0.34). Thus, the amplitude at each receiving circuit is 0.68V (=1.84−1.16).

In FIG. 4, just one receiving circuit 32 to 34 of each circuit block is described by way of example. However, the present invention is not limited by the number of the receiving circuits.

In the signal transmission circuit arranged as described above, the resistance of each of the resistors 80 to 83 is made equal to a value derived by subtracting a half of an impedance of the line 100 from an impedance of the intra-block transmission line 11. The impedance of the line 100 is required to be halved, because the signal from the driving circuit block is branched into two ways at a contact point B with the bus 100. That is, the following expression is established:

$$Rm = Zs - Z0/2 \tag{1}$$

where Zs denotes an impedance of the transmission line 11, Z0 denotes an impedance of the line 100, and Rm denotes a resistance of the resistor 80.

As is understood from this expression, the total impedance of the resistor 80 and the line 100 as viewed from the transmission line 11 is made equal to the impedance of the transmission line 11 itself. This makes it possible to prevent repetitive reflections inside of a branched line.

The resistors 81 to 83 may be defined by the similar method. As such, another block may have the same effect as the foregoing block 1.

Next, to describe the effect of the resistor derived by the expression (1), the kind of waveform which is transmitted to each point of FIG. 4 when the driving circuit 21 is switched from a Low output to a High output will be discussed below with reference to the circuit diagram of FIG. 4.

First, it is necessary to derive a potential of the transmission line 100 occurring when the driving circuit 21 feeds a Low output. The voltage of the transmission bus is made equal to the voltage derived by dividing the terminating supply voltage of 1.5 V by the termination resistors 50 and 51, the resistor 80 and the on resistance of the driving circuit 21. Concretely, the voltage at the point B on the transmission line when the driving circuit 21 provides a Low output is as follows:

$$1.5V \times (75\Omega+10\Omega)/(10\Omega+75\Omega+25\Omega)=1.16 \text{ (V)}$$

In the circuit of FIG.4, the signal driven from the driving circuit 21 is not reflected at the B point. Therefore, the overall signal is transmitted to the transmission line 100. The potential of the signal transmitted to the point B when the output of the driving circuit is switched from Low to High is equal to the voltage given by dividing the terminating supply voltage of 1.5 V and the supply voltage of 3 V of the driving circuit 21 by the terminating resistors 50 and 51, the resistor 80, and the on resistance of the driving circuit 21. Hence, the signal potential at the B point when the driving circuit 21 provides a High output is derived as follows:

$$1.5V+(3V-1.5V)\times 25\Omega/(10\Omega+75\Omega+25\Omega)=1.84 \text{ V}$$

That is, the amplitude of the signal transmitted to the point B is;

$$1.84V-1.16V=0.68 \text{ V}$$

When the signal of the amplitude of 0.68 V transmitted to the transmission line 100 reaches the point C, though the transmission line of 50Ω, the resistor of 75Ω and the transmission bus of 100Ω are viewed in the front, the mismatch of the impedance brings about reflection, because the total impedance of 38.9Ω of these two lines is different from the impedance of 50Ω of the transmission line through which the signal passes. The transmittance coefficient is:

$$1-\text{the reflection coefficient}=1-1-(50-38.9)/(50+38.9)=0.875$$

The potential of the signal passing through the point C is equal to the value derived by multiplying the signal amplitude of 0.68 V at the point B by the transmittance coefficient of 0.875 and adding an initial potential to the multiplied value. That is, the potential of the signal is:

$$0.68V \times 0.875+1.16V=1.76 \text{ V}$$

Similar reflections take place at the point E or the point G. The potential at the E or the G point are 1.68 V and 1.61 V, respectively.

Figure 7A:
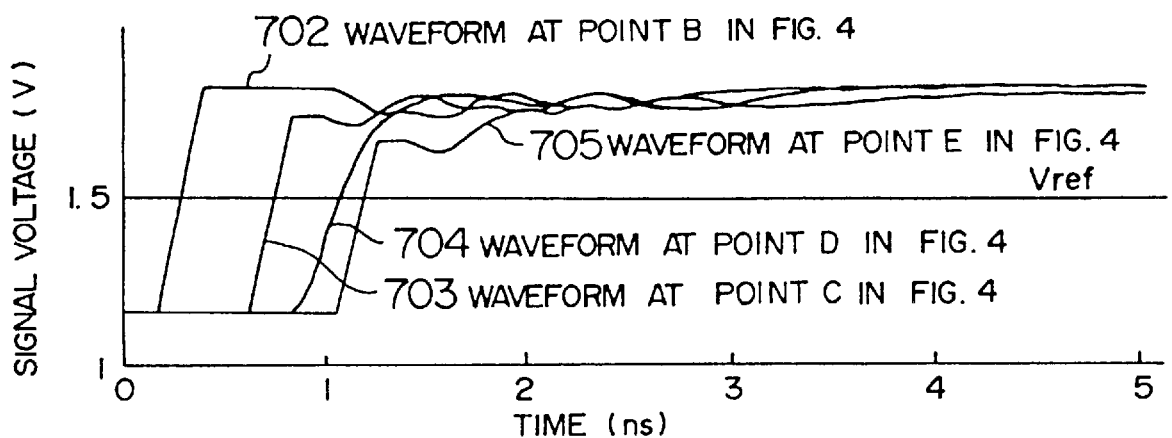
FIGS. 7A to 7C are graphs showing signal waveforms (leading waveforms) in the embodiment 1 of the present invention.
Figure 7B:
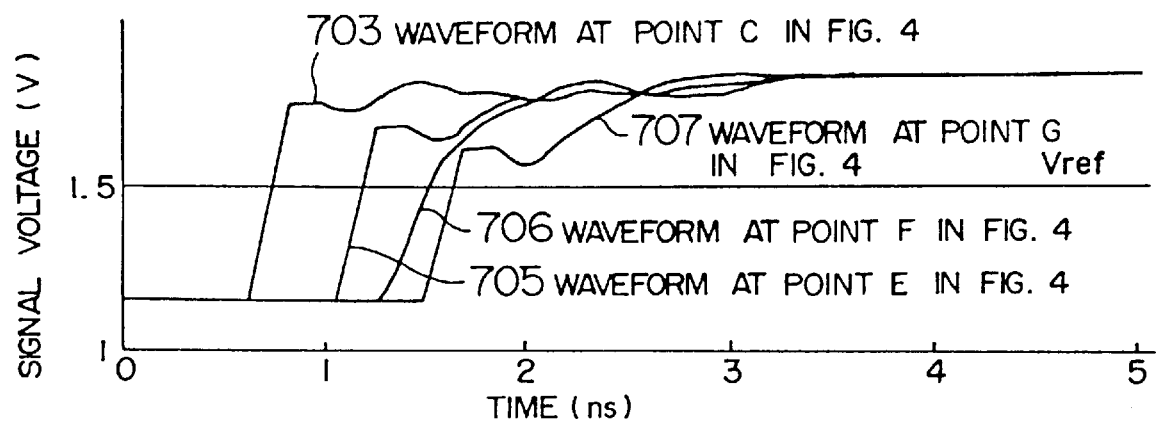
Figure 7C:
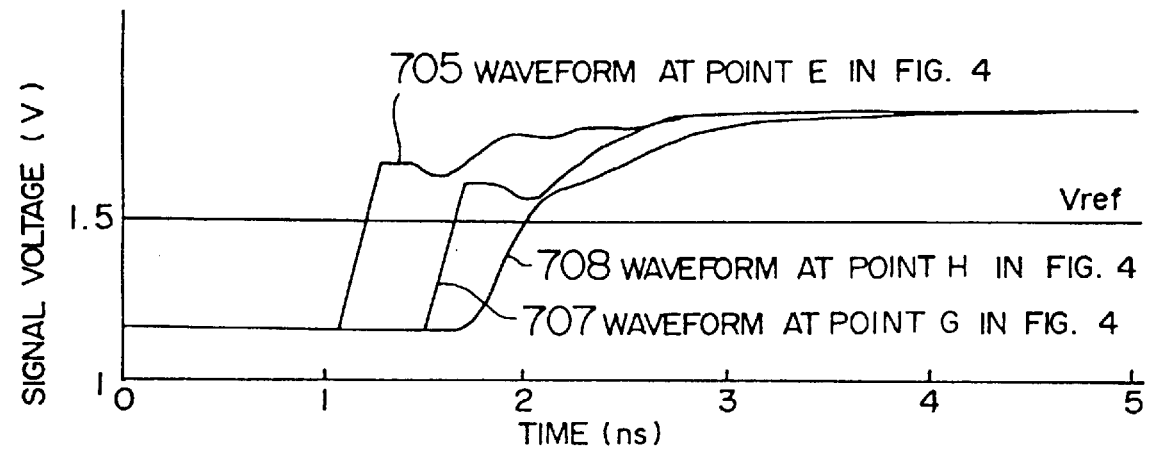
Figure 8A:
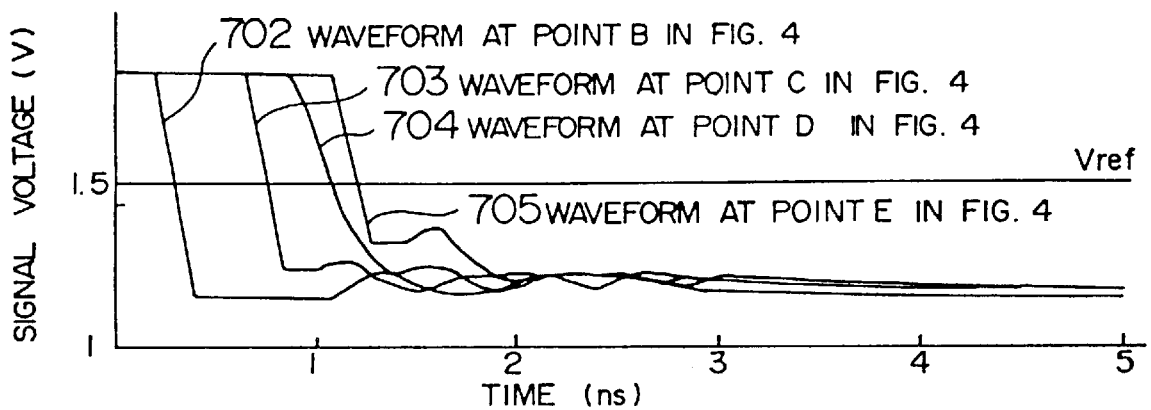
FIGS. 8A to 8C are graphs showing signal waveforms (tailing waveforms) in the embodiment 1 of the present invention.
Figure 8B:
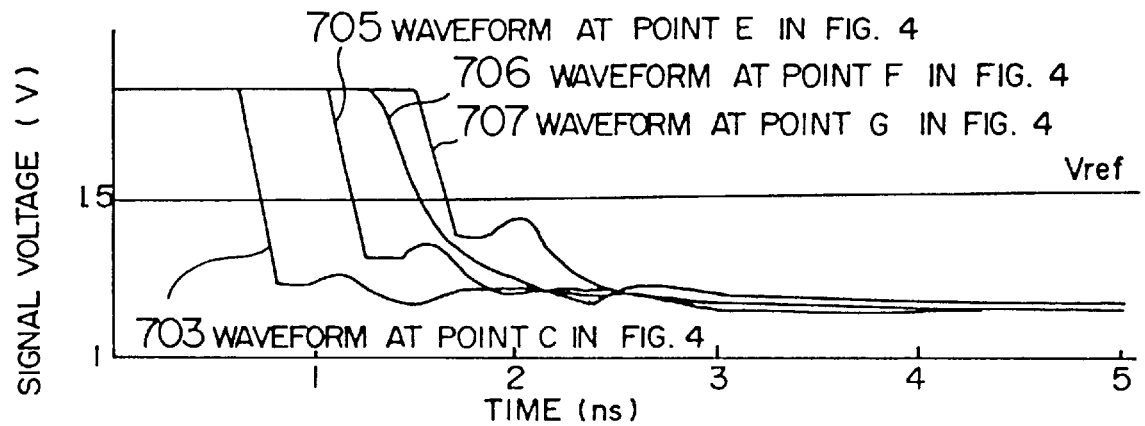
Figure 8C:
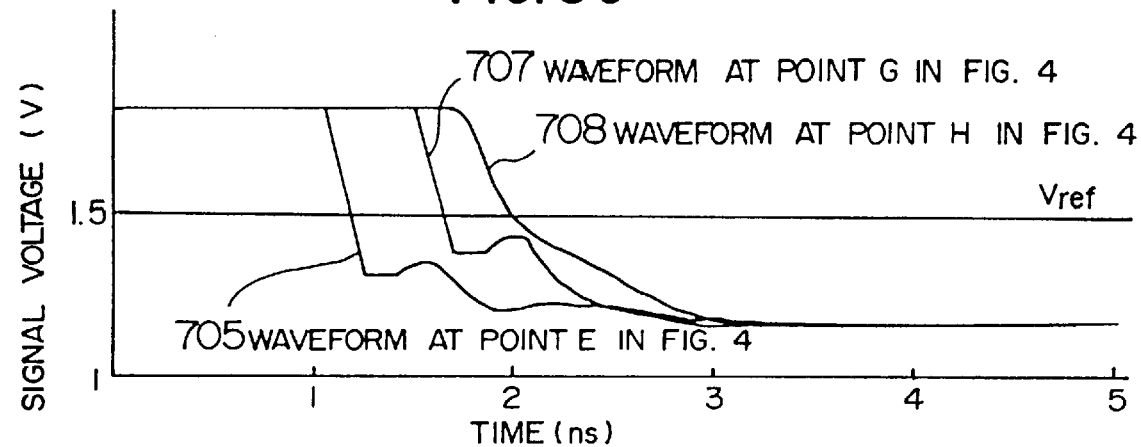

These results are shown in FIGS. 7A to 7C. FIG. 7A shows signal waveforms which come to and go out of the point C, that is, the signal waveform at the point B which comes to the point C and the signal waveforms at the points D and E which go out of the point C. Likewise, FIG. 7B shows signal waveforms which come to and go out of the point E. FIG. 7C shows signal waveforms which come to and go out of the point G. In FIGS. 7A–7C, a numeral 702 denotes a signal waveform at the point B in FIG. 4. A numeral 703 denotes a signal waveform at the point C. A numeral 704 denotes a signal waveform at the point D. A numeral 705 denotes a signal waveform at the point E. A numeral 706 denotes a signal waveform at the point F. A numeral 707 denotes a signal waveform at the point G. A numeral 708 denotes a signal waveform at the point H. When the signal drops, the same thing occurs. The signal waveforms at this time are shown in FIGS. 8A to 8C. In FIGS. 8A to 8C, numerals 702 to 708 denote the signal waveforms from the point B to the point H as in FIG. 4.

In the case of using the signal transmitting circuit clearly described in this embodiment, it is understood that it is possible for any first signal indicating a High level from the driving circuit 21 at each branch point to exceed the reference voltage (1.5 V in the above condition). Therefore, each receiving circuit will be able to recognize the High level being sent.

Such an effect of this invention is sufficiently brought about by the resistance for resistors 80 to 83 derived by the expression (1) as well as any value close to the resistance derived by the expression (1).

Figure 24:
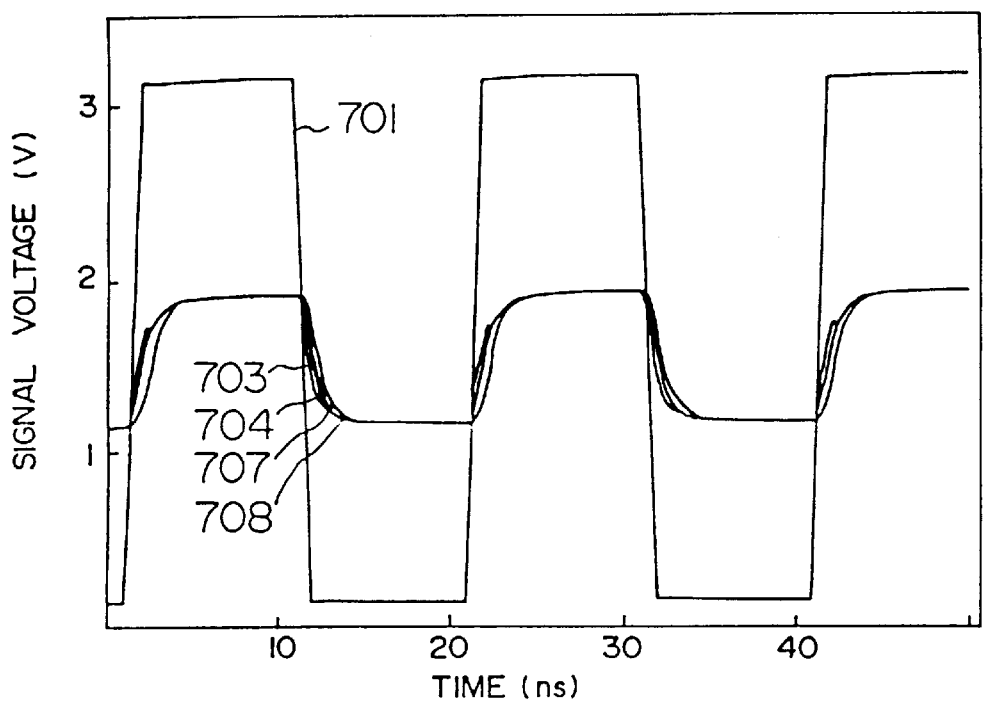
FIG. 24 is a graph showing a signal waveform occurring in a circuit arrangement shown in FIG. 4.

This will be described with reference to Figs.24 to 26. FIG. 24 shows the waveforms at the points A, C, D, G and H in FIG. 4 through the relation between a time and a voltage as the sending circuit 21 continues to output a pulse waveform in the circuit arrangement shown in FIG. 4 in which the inter-block transmission line (main transmission line) 100 has an impedance of 50Ω, each of the intra-block transmission lines 11 to 14 has an impedance of 100Ω, each of the terminating resistors 50 and 51 has a resistance of 50Ω, the terminating supply voltage is 1.65 V and each of the resistors 80 to 83 has a resistance of 75Ω obtained by the expression (1).

In FIG. 24, a numeral 701 denotes a signal waveform at the point A. A numeral 703 denotes a signal waveform at the point C. A numeral 704 denotes a signal waveform at the point D. A numeral 707 denotes a signal waveform at the point G. A numeral 708 denotes a signal waveform at the point H. It is difficult to visually separate the curve indicated by 707 from the curve indicated by 708, because both of the curves are overlapped with each other.

Figure 25:
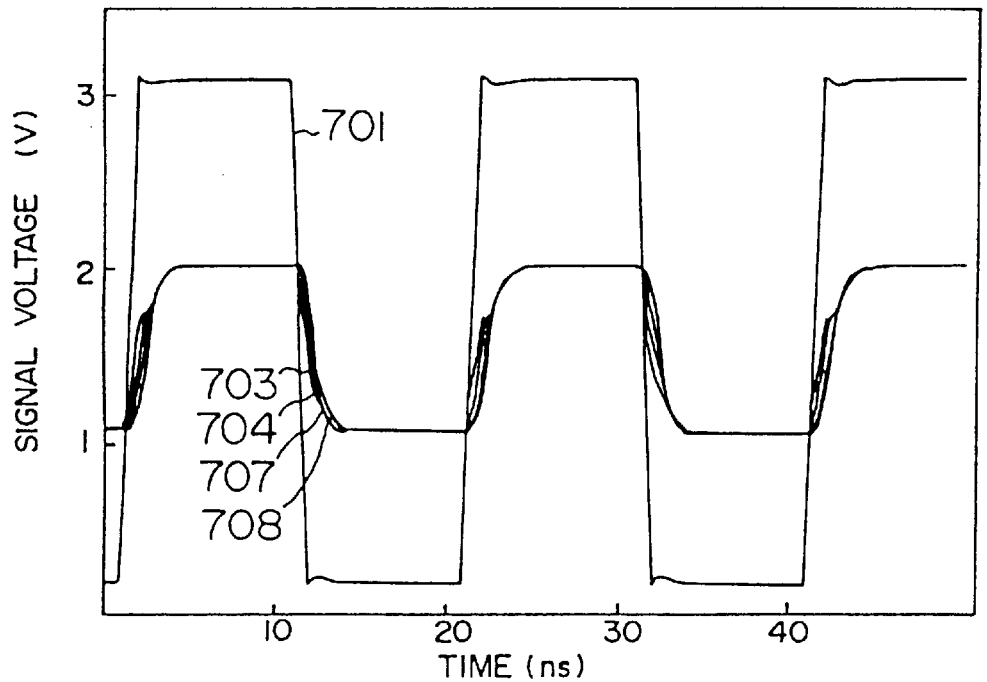
FIG. 25 is a graph showing a signal waveform occurring in a case that resistors 80 to 83 have smaller values in the circuit arrangement shown in FIG. 4.
Figure 26:
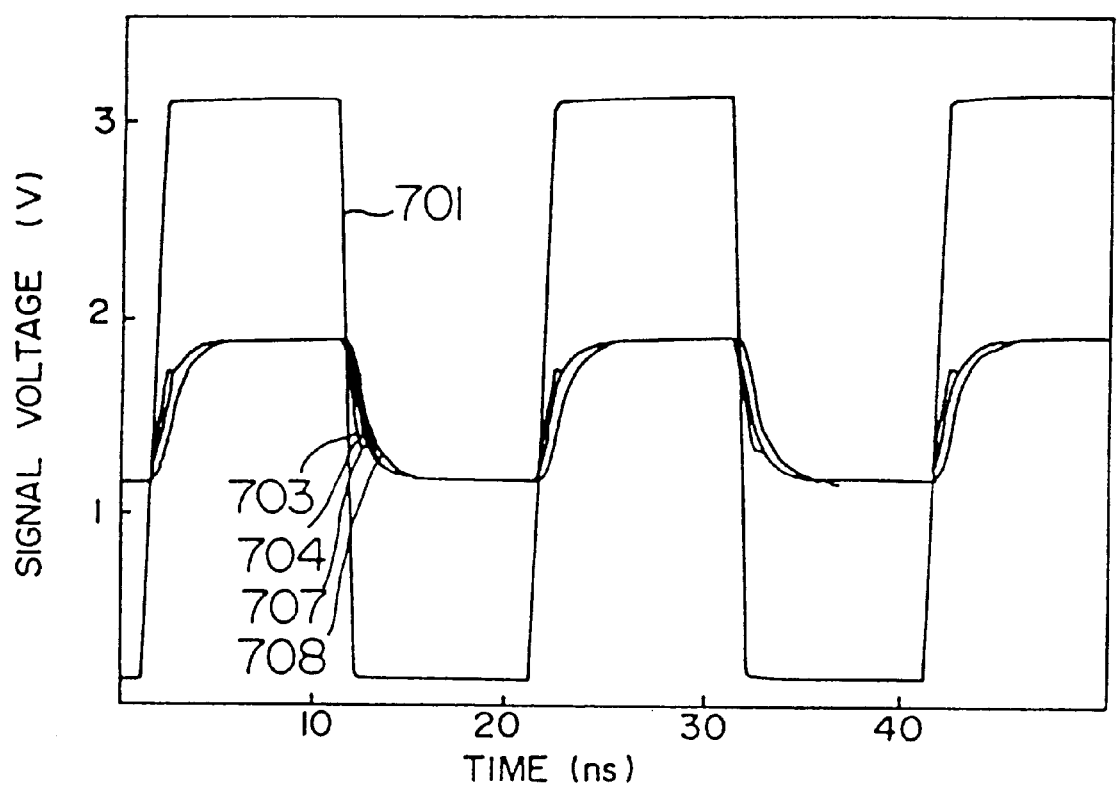
FIG. 26 is a graph showing a signal waveform occurring in a case that the resistors 80 to 83 have larger values in the circuit arrangement shown in FIG. 4.

On the other hand, the other condition is illustrated in FIG. 25. FIG. 25 shows a waveform when each resistance of the resistors 80 to 83 is changed to 50Ω for obtaining a larger amplitude. As in FIG. 25, numerals 701, 703, 704, 707 and 708 show the waveforms at the points A, C, D, G and H as in FIG. 4, respectively. The resistance 50Ω used herein is only 66% of the resistance of 75Ω obtained by the expression (1). As can be seen from FIG. 25, such resistance values may be used without any trouble.

If the impedance of the intra-block line is 75Ω, each resistance of the resistors 80 to 83 may be fixed to 75Ω for keeping the signal amplitude the same as the value of FIG. 24. The waveform for this case is shown in FIG. 26. In this case, each resistance of the resistors 80 to 83 is larger than the resistance of 50Ω obtained by the expression (1) by a factor of 50%. With regard to this, it should be noted if each resistance of the resistors 80 to 83 is shifted to and fro by about 50% relative to the value obtained by the expression (1), the effect of the present application can still be achieved.

Further, to enhance the effect of the invention, it is preferable to set the resistances of the resistors 80 to 83 to be a higher value than the impedance of the main transmission line 100. In addition, when the transmission line 100 has many branch lines, the signal from the driving circuit 21 cannot exceed the reference voltage even through the effect of the signal transmitting circuit used in this embodiment. A method for coping with this shortcoming will be clarified in the embodiment 3.

Each signal which enters into the transmission lines 12 to 14 at the points C, E and G is mirror-reflected on the corresponding receiving circuit and then returns to the branch point. Since this circuit keeps the impedances properly matched, the overall signal is transmitted to the transmission line 100 at one time without reflection of the signal on the branch point.

As is obvious from this figure, the resistors inserted in the present invention make it possible to greatly reduce the potential drop resulting from the reflection. Further, these resistors make the signal potential drop in a remote receiving circuit from the driving circuit negligible.

By inserting a resistor having a predetermined resistance around a contact between the transmission line inside of the circuit block and the inter-block transmission line, it is possible to keep the signal amplitude on the transmission bus smaller and transmit the signal at high speed. How much the amplitude is made smaller is allowed to be freely designed by changing the impedances of the transmission line 100 and each intra-block transmission line. For example, if the sending circuit 21 has an on resistance of 10Ω, assuming that the intra-block transmission line has an impedance of 100Ω and the transmission line 100 has an impedance of 25Ω, the signal amplitude of the transmission bus is calculated as follows:

$$1.5V \times 12.5\Omega/(12.5\Omega+87.5\Omega+10\Omega) \times 2 = 0.34 \text{ (V)}$$

in which each of the resistors 80 to 83 has a resistance of 87.5Ω. The waveforms at this case are shown in FIGS. 18A to 18C and 19A to 19C. In these figures, numerals 702 to 708 denote the signal waveforms at the B to the H points as in FIG. 4. From this figure, it is understood that a waveform with a smaller amplitude and a small drop is obtained.

Further, the resistors 80 to 83 have an effect of suppressing lowering of the impedance of the transmission line 100 resulting from the load capacitance in the circuit block. That is, by inserting a resistor between the transmission line 100 and each of the circuit blocks 1 to 5, the inter-block transmission line is not able to see the capacitance in the circuit block directly (i.e., the total of the transmission line load capacitance and the capacitance of the driving and receiving circuits). Hence, it is possible to suppress the lowering of the impedance of the transmission line.

Moreover, the signal transmitting system of the present invention offers a further advantageous effect in a situation where a new board is added to the transmission bus in operation or a mounted broad is pulled out, that is, if a so-called live-insertion is executed. For example, consider that a board charged up to the High level is inserted to the transmission line to which the Low signal is transmitted. In this case, since the potential of the in-board capacitance is different from the potential of the transmission line, current flows from the board to the transmission line. The current flow is transmitted to the transmission line. The flown current is further transmitted as a distorted waveform into the receiving circuit inside of the branched line. If this waveform distortion goes up to a higher potential than the reference voltage, the receiving circuit recognizes that the High signal is transmitted and thus malfunctions.

Figure 9:
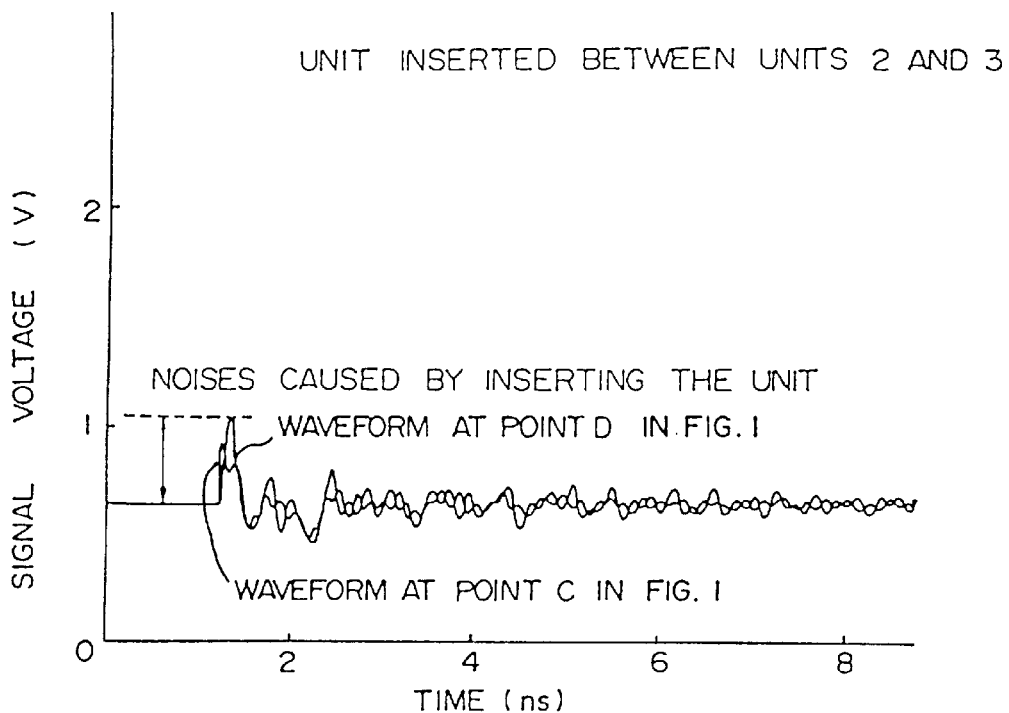
FIG. 9 is a graph showing a waveform distortion occurring when live-insertion is executed in the case of using the conventional transmission line.
Figure 10:
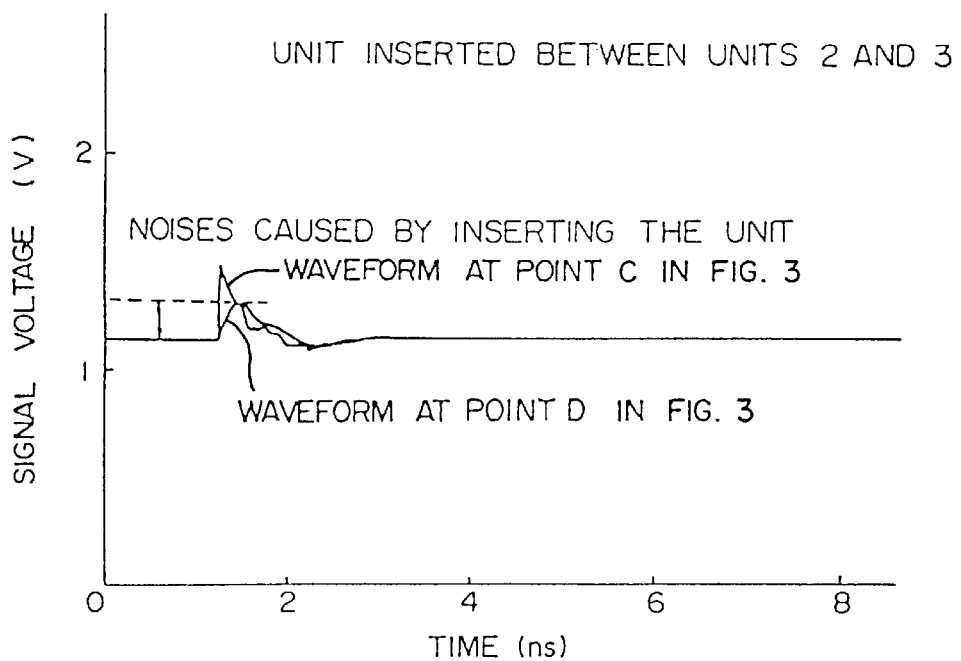
FIG. 10 is a graph showing a waveform distortion due to live-insertion in the case of using the circuit according to the embodiment 1 of the present invention.

To describe the effect of the waveform distortion, FIG. 9 shows a waveform occurring when the live-insertion is done in the conventional transmission line and FIG. 10 shows a waveform occurring when the live-insertion is done by the transmitting circuit offered by the invention. As shown in FIGS. 9 and 10, the waveform distortion caused by the live-insertion is reduced by the present invention.

Embodiment 2

The following description will be directed to embodiment 2 in which the present invention is applied to a bidirectional transmission line.

Figure 11:
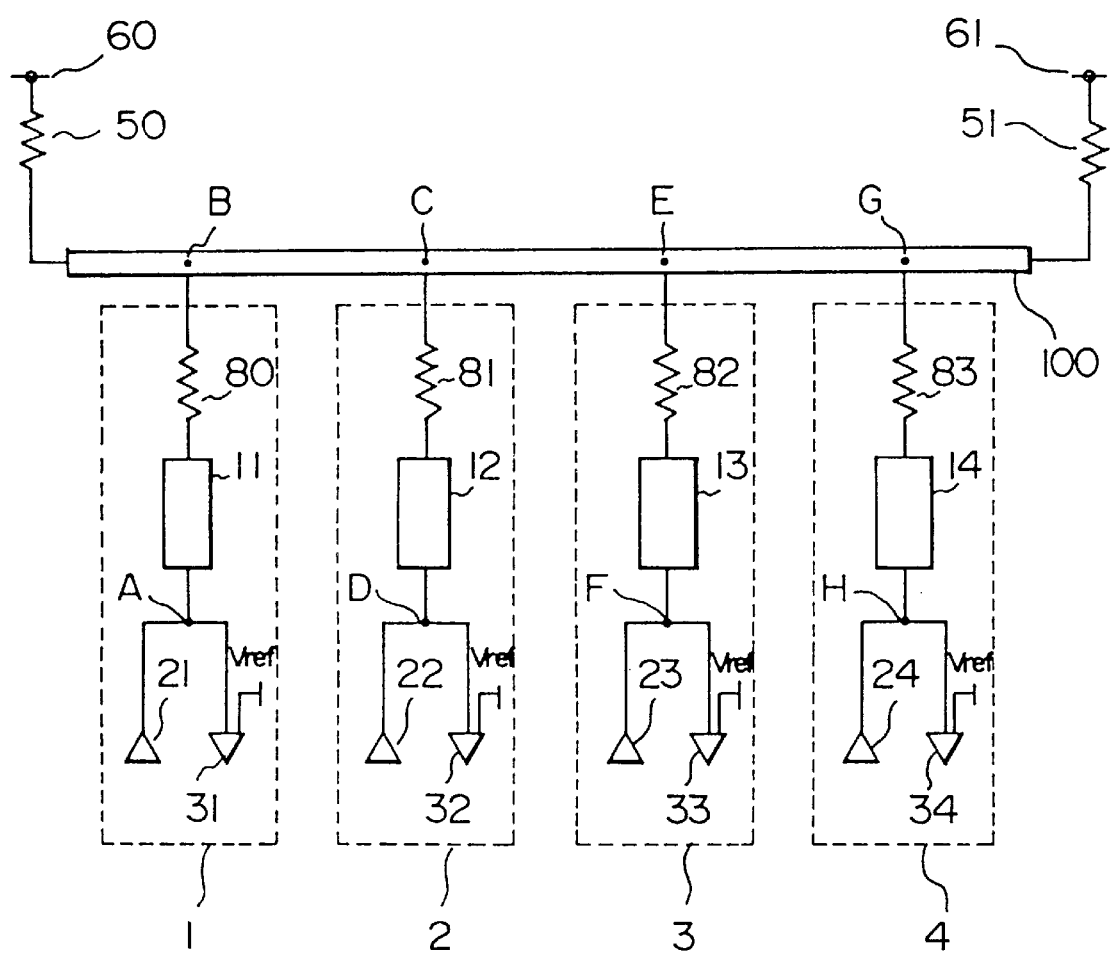
FIG. 11 is a block diagram showing an embodiment 2 of the present invention.

FIG. 11 is a fundamental block diagram showing the second embodiment. The circuit blocks 1 to 4 provide driving circuits 21 to 24, receiving circuits 31 to 34, resistors 80 to 83, and transmission lines 11 to 14, respectively. A transmission line 100 is connected to the circuit blocks 1 to 4 and is terminated by the resistors 50 and 51, each having a resistance equal to a characteristic impedance value of the transmission line 100.

FIG. 11 shows the transmission line terminated at both ends by the resistors. However, if desired, the transmission bus may be terminated at one end by one resistor. Further, FIG. 11 shows four blocks. In actuality, the present invention may apply to any transmission line if it is connected to two or more blocks.

The arrangements of the driving circuits 21 to 24 and the receiving circuits 31 to 34 included in the circuit blocks shown in FIG. 11 are the same as those described with reference to FIGS. 5 and 6. The values of the resistors 80 to 83 are allowed to be defined by the manner of the embodiment 1 indicated in FIG. 4. Further, assuming that the circuit block 1 operates to issue a signal, the signal waveforms at the points A to H are the same as those of the embodiment 1.

In the arrangement having the driving circuit and the receiving circuit in one circuit block indicated in the embodiment 2, by making the resistance equal to or close to the resistance obtained by the previous expression (1), it is possible to reduce the waiting time accompanied with switching of the driving circuit. Later, in the circuit arrangement shown in FIG. 11, the change of the signal waveform occurring when the driving circuit is switched will be described below.

At first, the driving circuit is switched in accordance with the following procedure.

(1) The driving circuit 21 outputs a High signal.

(2) 10 ns later than (1), the driving circuit 21 is switched to a high impedance state. At this time, the driving circuit 24 outputs a High signal.

After the driving circuit 21 is switched, the terminating potential drops the signal potential on the transmission line located close to the driving circuit 21 until the High signal from the driving circuit 24 reaches that part of the transmission line. Hence, the dropped waveform is transmitted to each branched line through the transmission line.

Figure 12A:
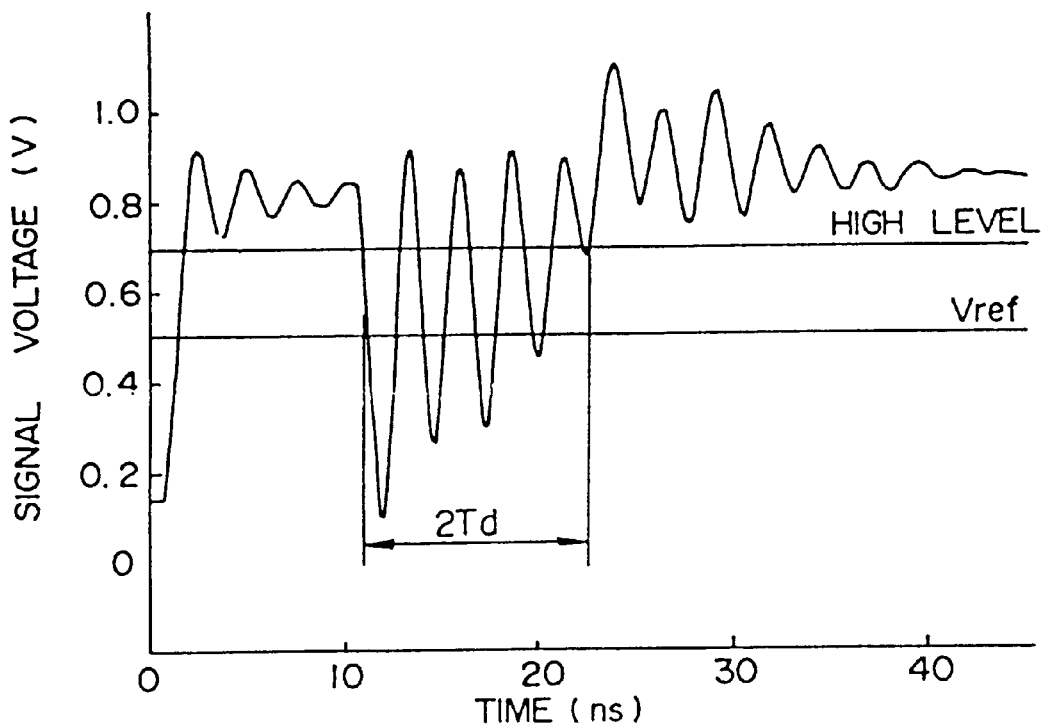
FIGS. 12A to 12B are graphs showing waveforms occurring when the sending circuit is switched by using the conventional transmission line.
Figure 12B:
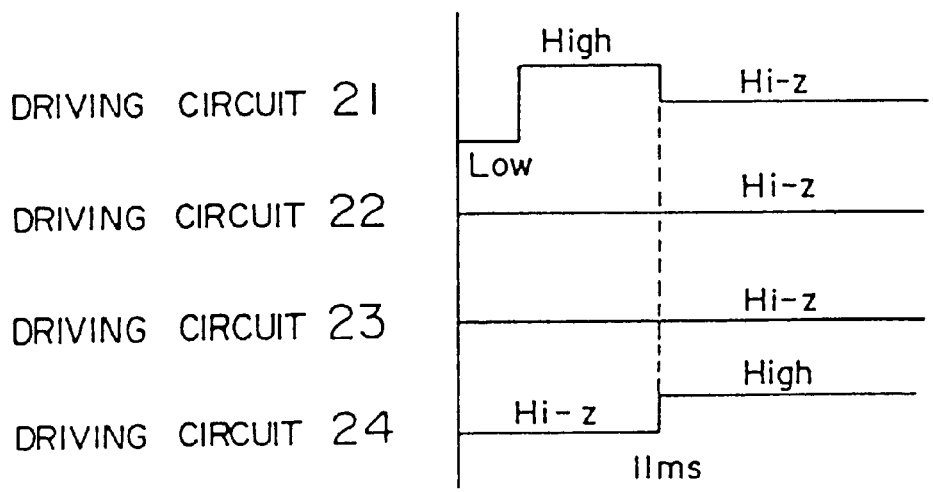
Figure 13A:
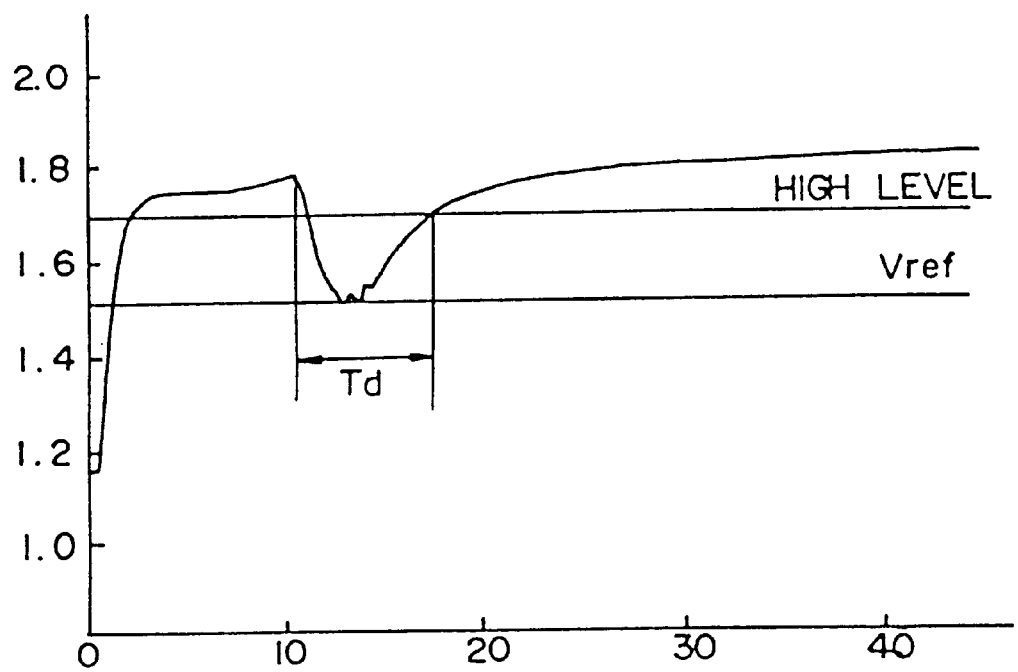
FIGS. 13A to 13B are diagrams showing waveforms of switching operation by driving circuit of the embodiment 2.
Figure 13B:
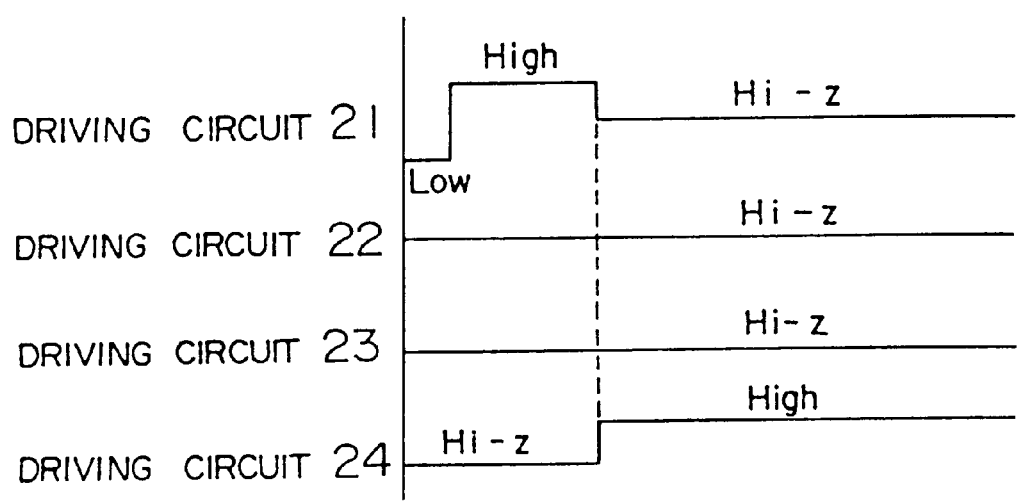

The dropped waveform at each point occurring in the case of the conventional transmission line with no resistor is shown in FIGS. 12A and 12B, while the dropped waveform at each point estimated about the transmission line of the present invention is shown in FIGS. 13A and 13B. The waveforms in these figures are those at the input circuit block of the receiving circuit 32 included in a circuit block 2 adjacent to a circuit block 1 having the driving circuit 21.

As is obvious from FIGS. 12A and 12B, in the conventional transmission line, the overlapped adverse effects of repetitive reflections in the branched line and the dropped signal caused by switching the driving circuit result in delaying when the receiving circuit reads an input signal, that is, 2Td later than when the driving circuit is switched. Td indicated a time when a signal is transmitted from one end to the other end of the transmission line. Herein, Td is about 6 ns.

On the other hand, the transmission line according to the present invention needs only a delay of Td after the driving circuit is switched before the receiving circuit reads the input signal. That is, the present invention provides a capability of reducing a waiting time required to read the input signal after the driving circuit is switched from 2 Td to Td.

The foregoing embodiment has been described for High to High switching. This operation holds true to all kinds of switchings such as Low to Low, Low to High, and High to Low. Further, this effect is active in any combination without depending on a driving circuit to be switched.

Embodiment 3

Figure 14:
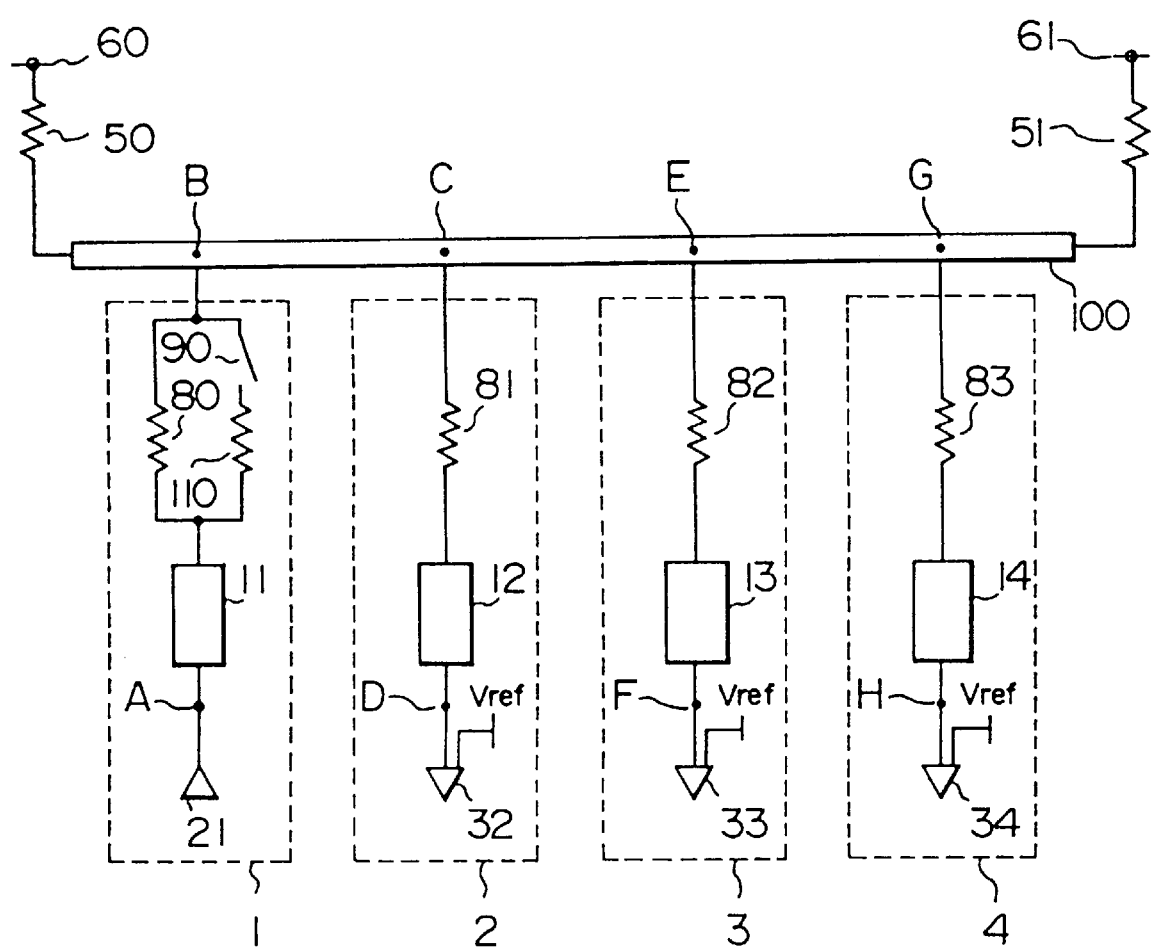
FIG. 14 is a block diagram showing an embodiment 3 of the invention.
Figure 15:
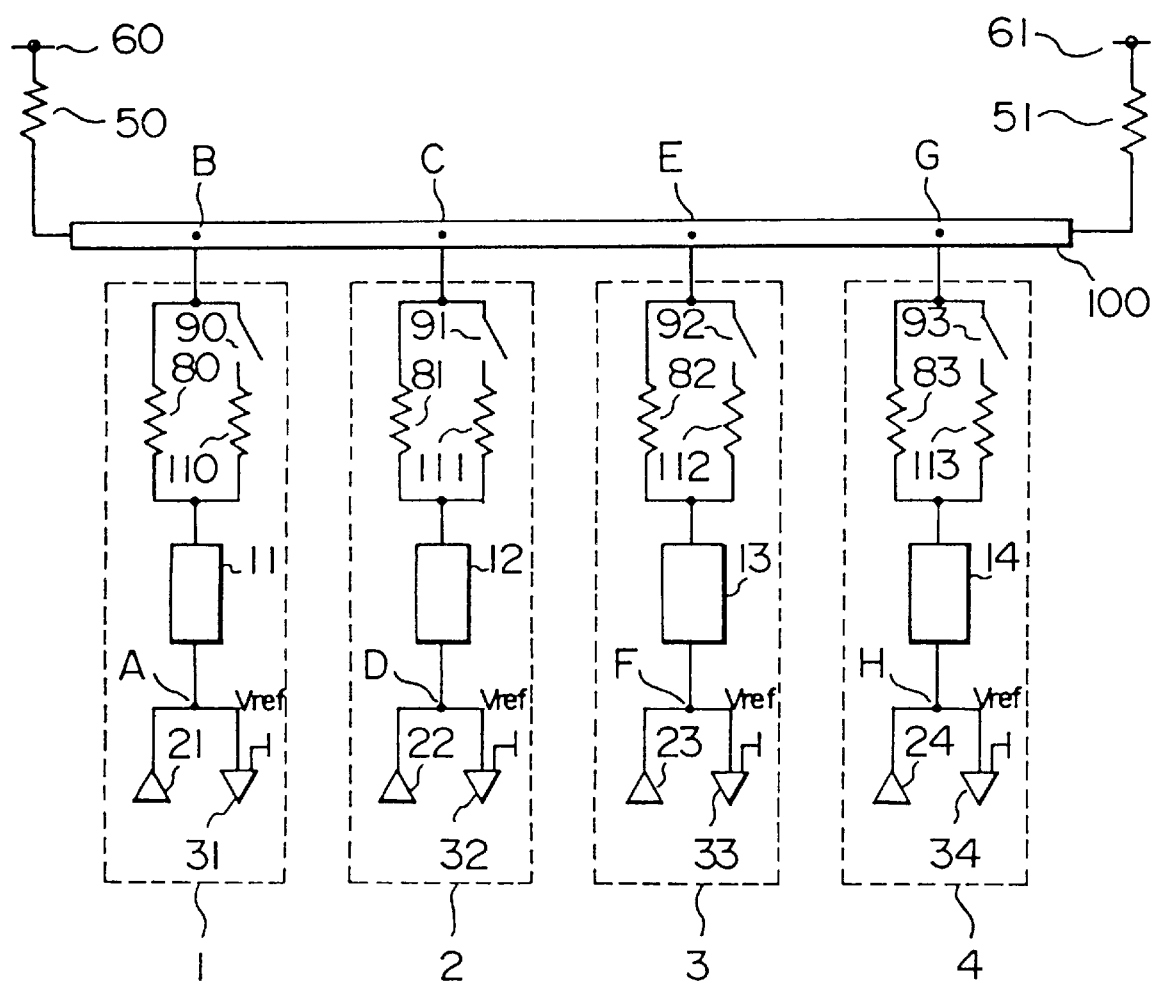
FIG. 15 is a diagram showing a modification of the embodiment 3.
Figure 19A:
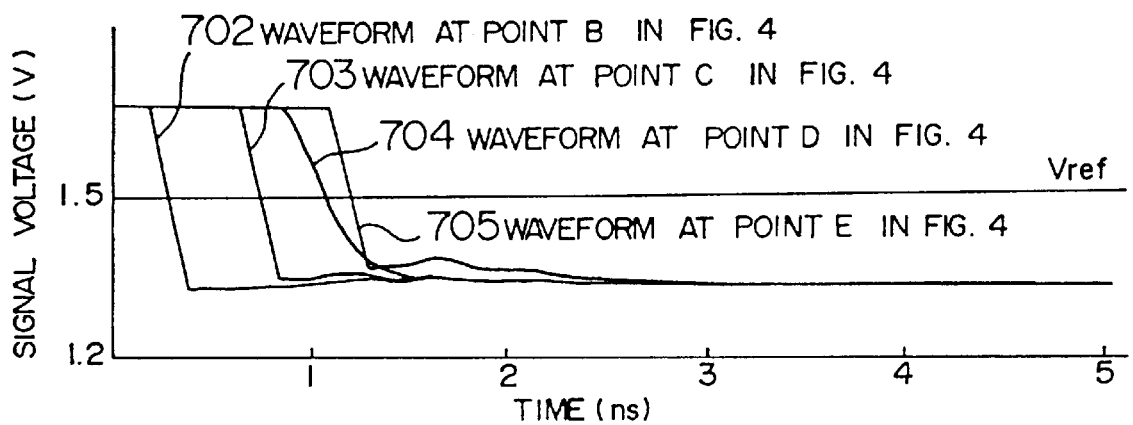
FIGS. 19A to 19C are graphs showing signal waveforms (tailing waveforms) occurring in the case of changing an impedance on a transmission line in the circuit according to the embodiment 1 of the present invention.
Figure 19B:
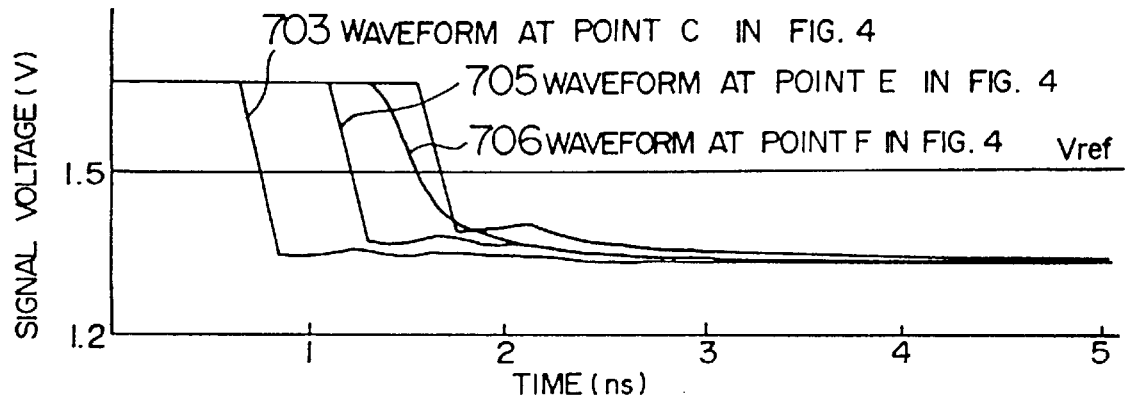
Figure 19C:
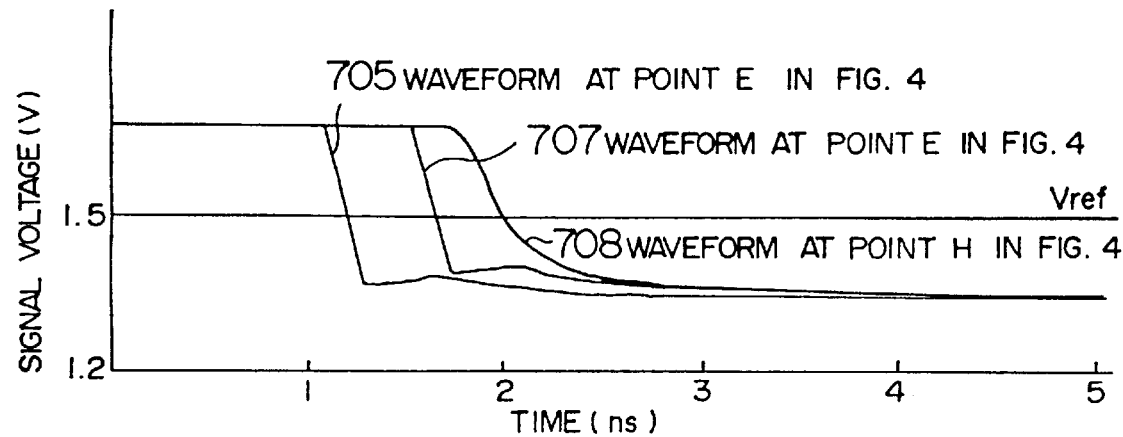

The following description will be directed to a third embodiment which is particularly effective in the case of providing a large capacitance at the tip of each branched line in a situation where there are many branched lines. FIG. 14 is a fundamental block diagram for explaining a unidirectional transmission bus according to this embodiment. FIG. 15 is a fundamental block diagram for explaining a bidirectional transmission bus according to this embodiment. In FIG. 14, a circuit block 1 includes a driving circuit 21, and circuit blocks 2 to 4 include receiving circuits 32 to 34, respectively. Further, the blocks have resistors 80 to 83 and transmission lines 11 to 14, respectively. In FIG. 15, the circuit blocks 1 to 4 provide sending circuits 21 to 24, receiving circuits 31 to 34, resistors 80 to 83, and transmission lines 11 to 14, respectively. In FIGS. 14 and 15, the transmission line 100 is connected to the circuit blocks 1 to 4, and is terminated by resistors 50 and 51 each having a resistance equivalent to a characteristic impedance value of the transmission line 100.

In FIGS. 14 and 15, the transmission line is terminated at both ends by the resistors. However, if preferred, the transmission line may be terminated at one end by one resistor. Further, in FIGS. 14 and 15, the number of blocks is 4. In actuality, the present invention is applicable only if two or more blocks are provided.

Incidentally, in these figures numerals 90 to 93 denote switches. Numerals 110 to 113 denote resistors.

In this embodiment, the operation and the effect of the switches will be described with reference to the fundamental block diagrams of FIGS. 14 and 15. The other parts of this third embodiment are the same as those of the embodiments 1 and 2. Therefore, description about such other parts is not provided here to avoid redundancy.

If the capacitance at the tip of the branched line is great or if a large number of branched lines are provided, the drop of the signal potential at the branch point of the transmission line is unacceptably large. Even the embodiments 1 and 2 are unable to suppress such a large drop.

For example, consider the condition indicated in the embodiment 1, that is, the circuit arranged so that in FIG. 4 the transmission line 100 has an impedance of 50Ω, each branched line 11 to 14 has an impedance of 100Ω, each of the terminating resistors 50 and 51 has a resistance of 50Ω, each of the termination power supply has a voltage of 1.5 V, each of the resistors 80 to 83 has a resistance of 75Ω, the on resistance of the sending circuit 21 is 10Ω, the driving circuit 21 operates to connect the transmission bus to a 3-V power supply when the circuit 21 feeds a High signal, and the driving circuit 21 operates to connect the transmission bus to the ground or 0-V supply when the circuit feeds a Low signal. In such a time, if seven or more branched lines are provided, the first signal from the sending circuit 21 indicating a High level will not exceed the reference voltage (Vref) after the sixth branch point.

To overcome this shortcoming, the third embodiment will be described as a method of eliminating a delaying time caused by a dropped signal potential. This is accomplished by passing more current than an amount of current necessary for compensating the drop of the signal potential at the branch point.

At first referring to FIG. 14, when the driving circuit 21 is operated, the switch 90 in the circuit 1 closes to lower the resistance between the transmission line 100 and the intrablock signal transmission line 11. This makes it possible to increase a signal amplitude on the bus 100. The same holds true for the operation of the driving circuits 21 to 24 and their corresponding switches 90 to 93 in FIG. 15.

For example, on the condition that each of the terminating resistors 50 and 51 has a value of 50Ω, each of matching resistors 80 to 83 has a value of 75Ω, each of the sending circuits 21 to 25 has an on resistance of 10Ω, and each of the switch resistors 80 to 83 has a value of 10Ω, by closing the switch 90, the resistance between the transmission line 100 and the branched line 11 is decreased from 75Ω to 8.8Ω and the amplitude on the transmission bus 100 is increased from 0.68 V to 1.3 V. This results in eliminating the delay time caused by the dropped signal potential at the branch point.

To transfer the signal at high speed if the signal is reversed at the next cycle, the switch is enabled to open 0.3 cycle later than the starting time for outputting a signal from the driving circuit. By this, the signal amplitude is allowed to be returned to the predetermined value, that is, a suitably small amplitude for enabling the fast transfer. Of course, the delay could be set to be different thin 0.3 cycle, where appropriate.

FIGS. 16A to 16C and 17A to 17C are the drawings for explaining the effect of this invention. The waveforms shown in these figures are those occurring when the driving circuit 21 is enabled by the circuits shown in FIGS. 14 and 15. FIGS. 16A to 16C show the waveforms on the rise. FIGS. 17A to 17C show the waveforms on the drop. For purposes of example, the resistance of resistors 110 through 113 was set at 20Ω each for arriving at these waveforms.

FIGS. 16A and 17A show the signal waveforms which come to and go out of the point C shown in FIG. 14, that is, the waveform at the point B which comes to the point C and the waveforms at the points B and E which go out of the point C. Likewise, FIG. 16B and 17B show the signal waveforms which come to and go out of the point E. FIGS. 16C and 17C show the signal waveforms which come to and go out of the point G. A numeral 1402 denotes the signal waveform at the point B shown in FIG. 14. A numeral 1403 denotes the signal waveform at the point C. A numeral 1404 denotes the signal waveform at the point D. A numeral 1405 denotes the signal waveform at the point E. A numeral 1406 denotes the signal waveform at the point G. A numeral 1408 denotes the signal waveform at the point H.

The use of the switch makes it possible to increase the signal amplitude on the transmission line 100 and to eliminate the delay time caused by the dropped signal potential at the branch point. As described above, the switch control makes it possible to transfer a signal of a small amplitude at fast speed even in a transmission line having large load capacitance or a large number of branched lines. Though the switch control is not shown, the switch is controlled by a control unit included in the circuit block having the driving circuit in accordance with conventional switching techniques.

Figure 20:
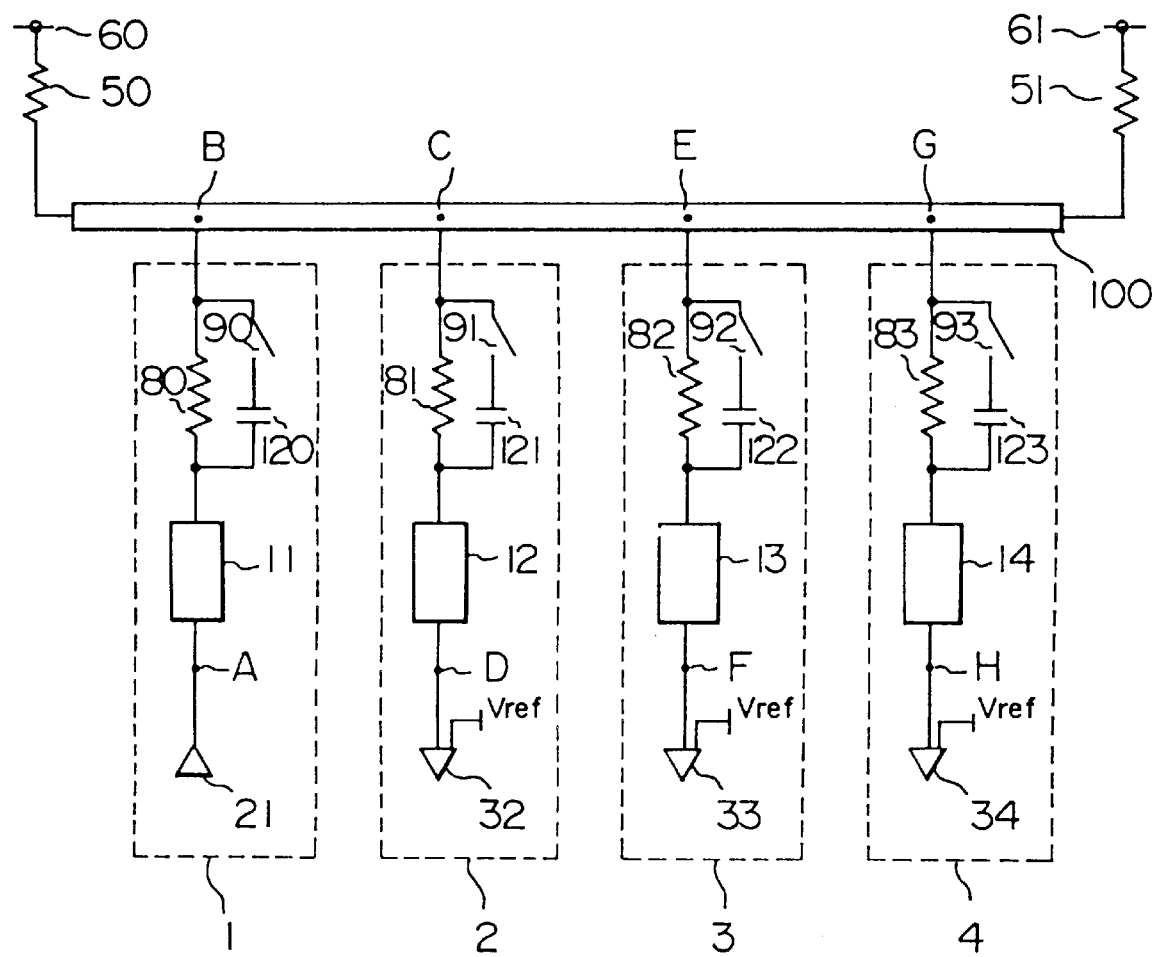
FIG. 20 is a circuit diagram showing an arrangement of the embodiment 3 of the present invention in which a capacitor is used in place of the resistor.
Figure 21:
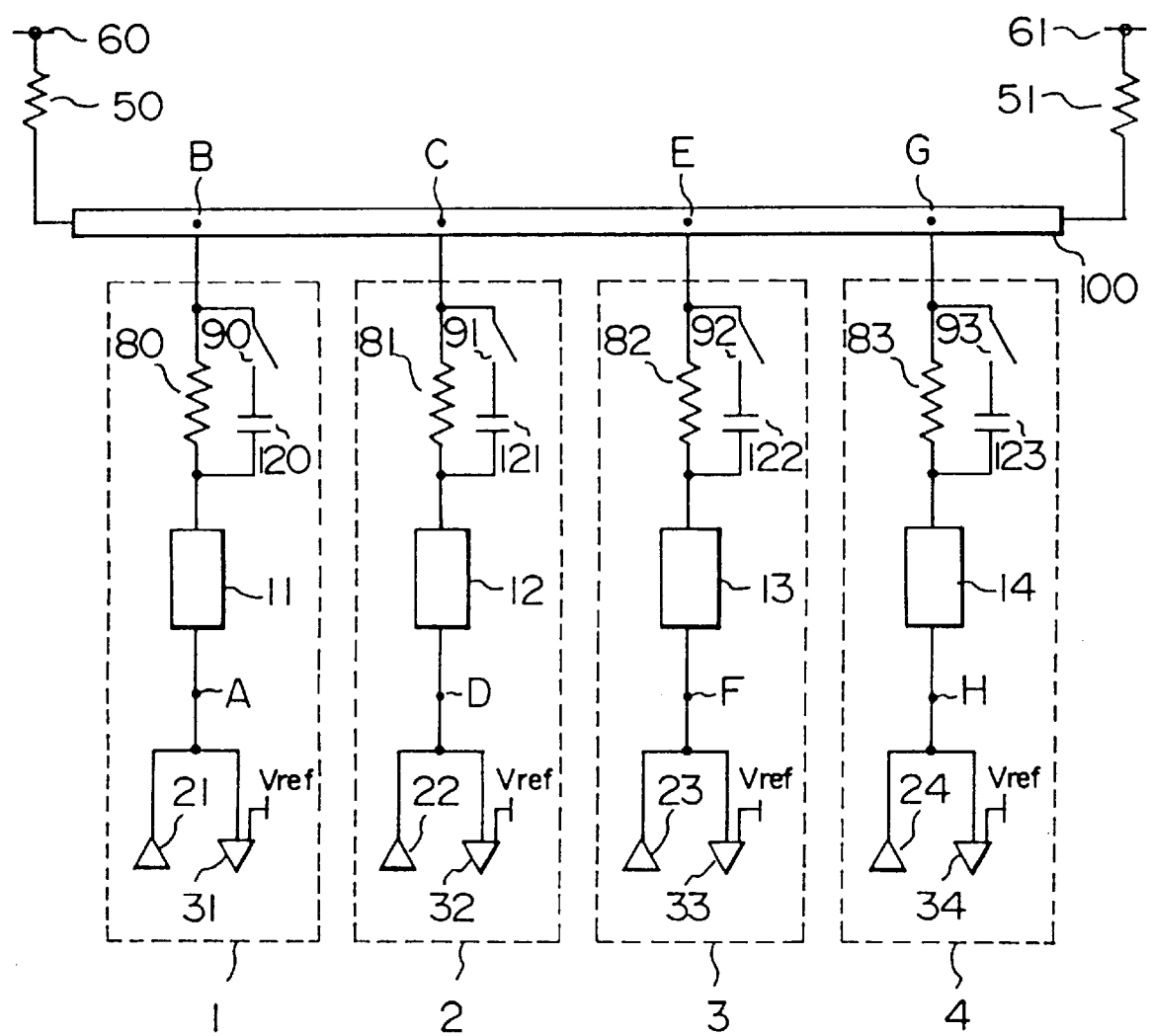
FIG. 21 is a circuit showing another arrangement of the embodiment 3 of the present invention in which a capacitor is used in place of the resistor.

In place of the resistors 110 to 113, similar effects can be offered by using capacitors. Embodiments arranged to use such capacitors are shown in FIGS. 20 and 21. FIG. 20 shows the same arrangement as that shown in FIG. 14 in which a capacitor 120 is used in place of the resistor 110. FIG. 21 shows the same arrangement as that shown in FIG. 15 in which capacitors 120 to 123 are used in place of resistors 110 to 113. It is preferable that the capacitance, in general, is about several tens of pico-farads.

If the potential on the capacitor driving side is changed on the signal from the sending circuit, the potential of the capacitor on the transmission line 100 will also rise according to the charge conservation law. Hence, a larger amplitude can be obtained relative to the amplitude changed only through the resistors 80 to 83.

With regard to the switches, it is preferable to close the switch contained in the unit for operating the driving circuit and open the other switches. Further, the signal amplitude on the transmission bus 100 is increased through the effect of the capacitor line and is returned to the initial amplitude through the effect of the terminals 50 and 51 in about several nano seconds. Hence, while the driving circuit is in operation, the switches may be kept closed.

Figure 22A:
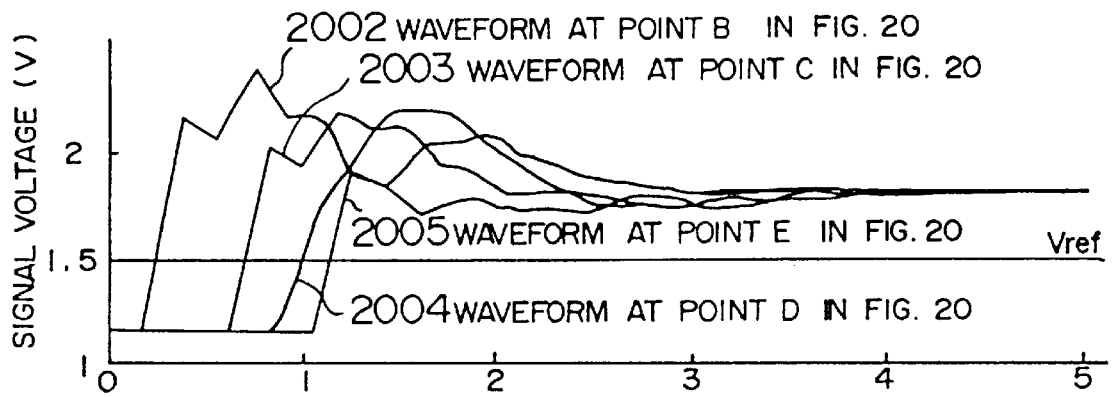
FIGS. 22A to 22C are graphs showing signal waveforms (leading waveforms) occurring in the case of using the arrangement shown in FIG. 20.
Figure 22B:
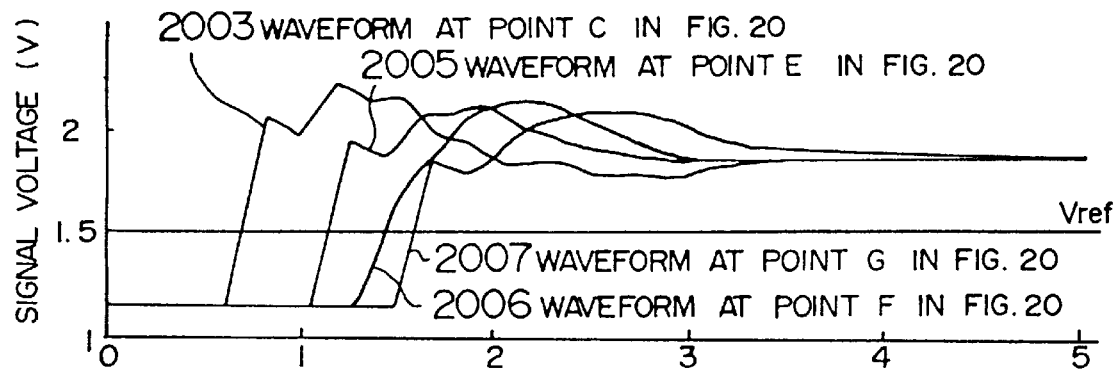
Figure 22C:
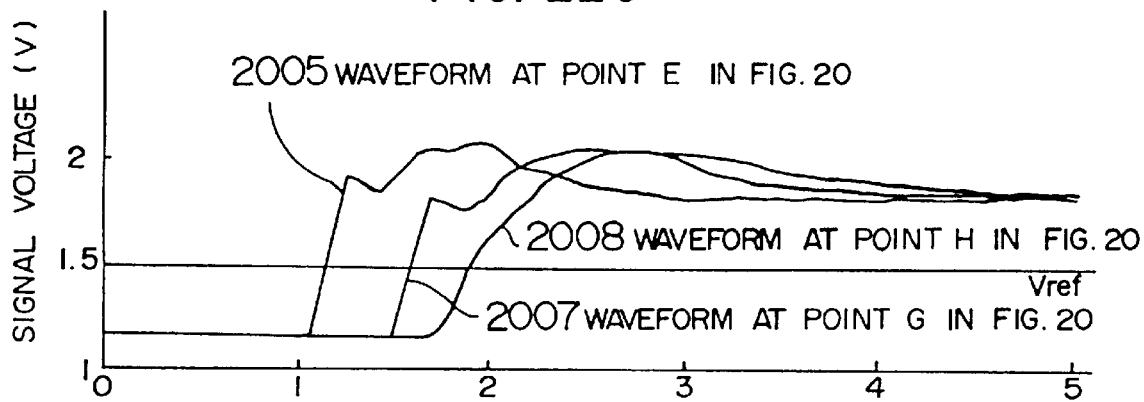
Figure 23A:
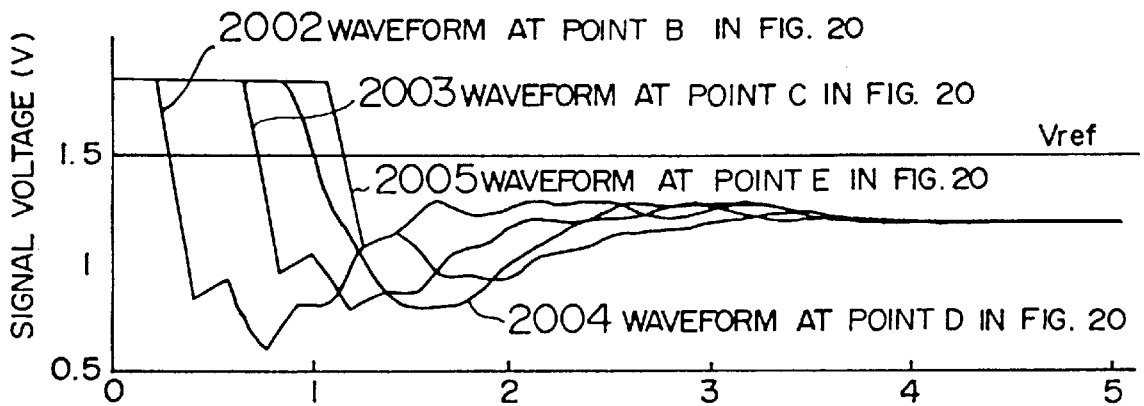
FIGS. 23A to 23C are graphs showing signal waveforms (tailing waveforms) occurring in the case of using the arrangement shown in FIG. 20.
Figure 23B:
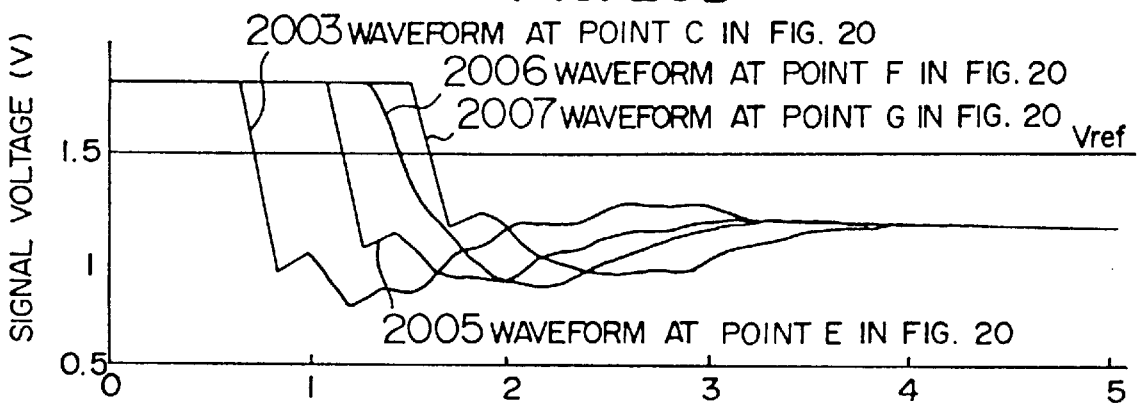
Figure 23C:
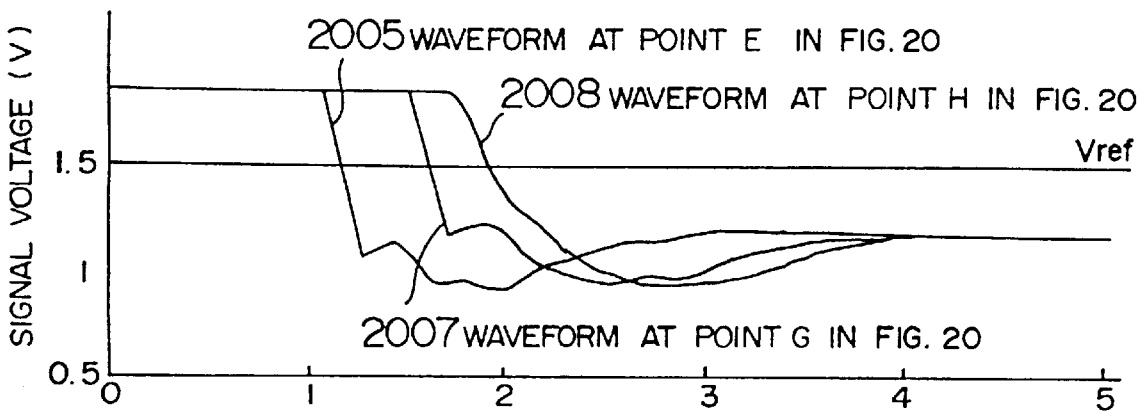

FIGS. 22A to 22C and 23A to 23C show the rising waveform and the dropping waveform at each point when the driving circuit 21 is operated in the circuit diagram of FIG. 20. In FIGS. 22A to 22C and 23A to 23C, FIGS. 22A and 23A show the signal waveforms which come to and go out of the point C of FIG. 20, that is, the signal waveform on the point B which comes to the point C and the signal waveforms on the points D and E which go out of the point C. Likewise, FIGS. 22B and 23B show the signal waveforms which come to and go out of the point E. FIGS. 22C and 23C show the signal waveforms which come to and go out of the point G. In these figures, a numeral 2002 denotes the signal waveform at the point B of FIG. 20. A numeral 2003 denotes the signal waveform at the point C. A numeral 2004 denotes the signal waveform at the point D. A numeral 2005 denotes the signal waveform at the point E. A numeral 2006 denotes the signal waveform at the point F. A numeral 2007 denotes the signal waveform at the point G. A numeral 2008 denotes the signal waveform at the point H.

As described above, the signal amplitude on the transmission line 100 is allowed to be increased through the effect of the capacitors, thereby eliminating the delay time caused by the dropped signal potential at a branch point.

Embodiment 4

Figure 27:
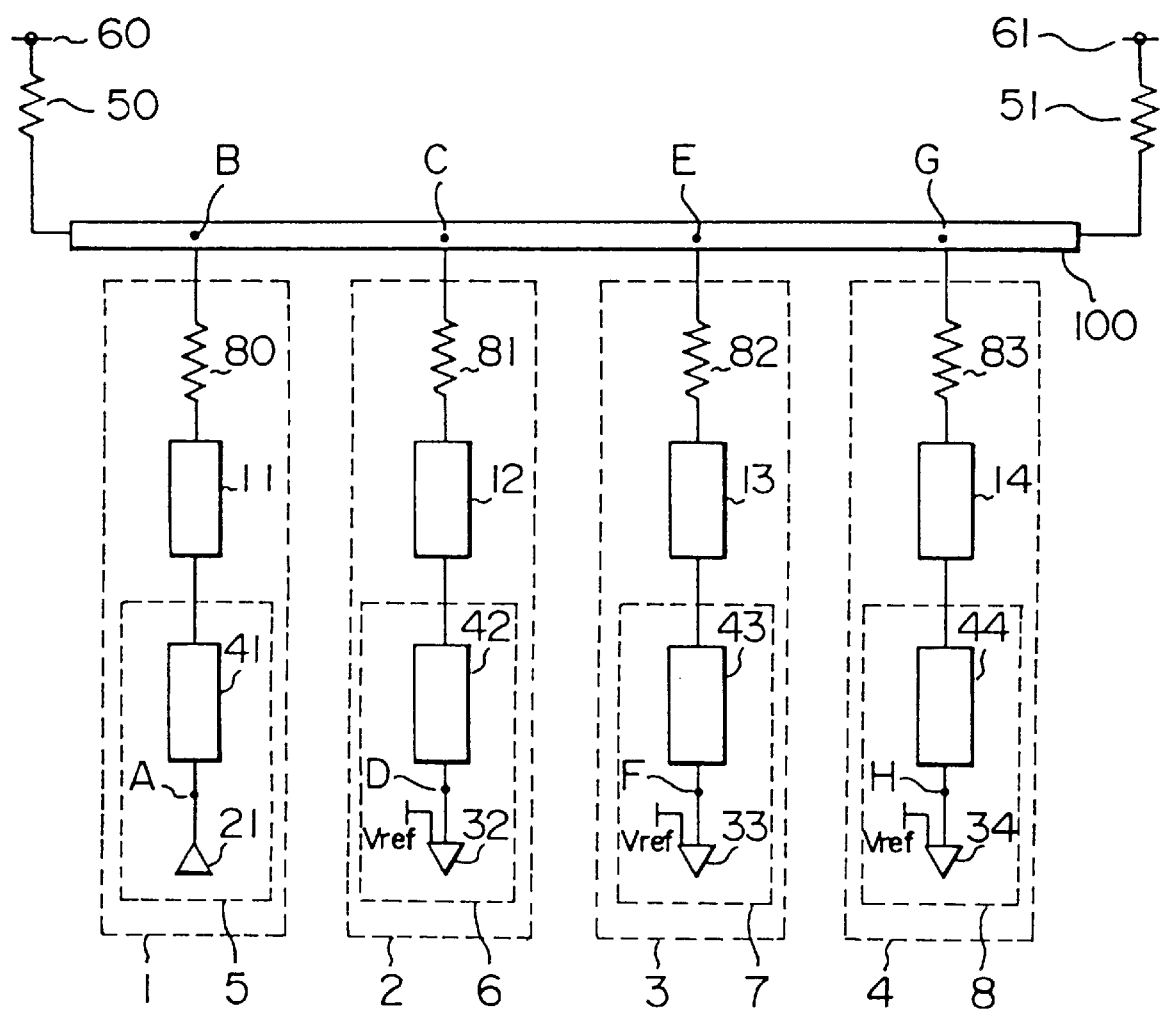
FIG. 27 is a block diagram showing an embodiment 4 of the present invention.

FIG. 27 shows an embodiment in which the driving circuit and the receiving circuit are integrated so that an inter-circuit block transmission line is connected to an intra-circuit block transmission line through an transmission bus like a lead of an integrated circuit.

In FIG. 27, a numeral 5 denotes an inner circuit block (an inner unit, for example, an integrated circuit) which is mounted on a circuit block 1 (for example, a board having an integrated circuit mounted thereon). Numerals 6 to 8 denote inner circuit blocks having receiving circuits 32 to 34, respectively, which inner circuit blocks are mounted inside of the circuit blocks 2 to 4, respectively. The circuit blocks 1 to 4 have resistors 80 to 83 and transmission lines 11 to 14 and 41 to 44, respectively. The transmission lines 11 to 14 are designed to have the same or almost the same characteristic impedance as that of the transmission lines 41 to 44. Further, the transmission line 100 has the circuit blocks 1 to 4 connected thereto and is terminated at both ends by the resistors 50 and 51 having a resistance equal to or close to the same characteristic impedance as that of the transmission line 100.

Also in this embodiment, the transmission line may be terminated at one end by one resistor. The necessary number of the receiving circuit blocks is one or more.

Figure 28:
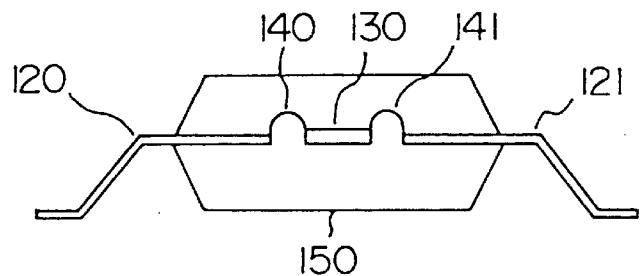
FIG. 28 is a sectional view showing a QFP package.
Figure 29:
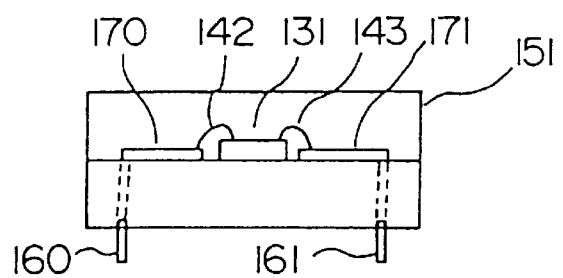
FIG. 29 is a sectional view showing a PGA package.

FIG. 28 shows a section of a QFP (Quad Flat Package) package. FIG. 29 shows a section of a PGA (Pin Grid Array) package. In FIG. 28, when a driving signal is to be provided, a chip 130 serving as a driving circuit operates to output a signal by way of bonding wires 140, 141 and lead frames 120, 121, in sequence. When receiving the signal, the chip 130 receives the signal by way of the lead frames 120, 121 and the bonding wires 140, 141, in sequence. In FIG. 29, when a driving signal is provided, the chip 131 operates to output a signal by way of bonding wires 142, 143, in-package wire patterns 170, 171, and I/O pins 160, 161 in sequence. When receiving a signal, the chip 131 receives a signal in a way of the I/O pins 160, 161, the in-package wire patterns 170, 171, and the bonding wires 142, 143 in sequence. In FIGS. 28 and 29, the lead frames 120, 121, the in-package wire patterns 170, 171 and the I/O pins 160, 161 need to have the characteristic impedance matching described in the present invention.

In general, the characteristic impedance of the board often takes a value of 60 to 100Ω. Hence, the most preferable method is that the lead frames 120, 121 and the in-package wire patterns 170, 171 are designed to each have a characteristic impedance value in the range of 60 to 100Ω.

To describe how the above components correspond to the portions shown in FIG. 27, the sending circuit 21 and the receiving circuits 32 to 34 correspond to the chips 130 and 131. The transmission lines 41 to 44 correspond to the lead frames 120, 121, the in-package wire patterns 170, 171 and the I/O pins 160, 161. The inner circuit blocks 5 to 8 correspond to the QFP package and the PGA package itself. In addition to the package form shown in FIGS. 28 and 29, any package form may be taken only if the substantially similar components are integrated.

Figure 30:
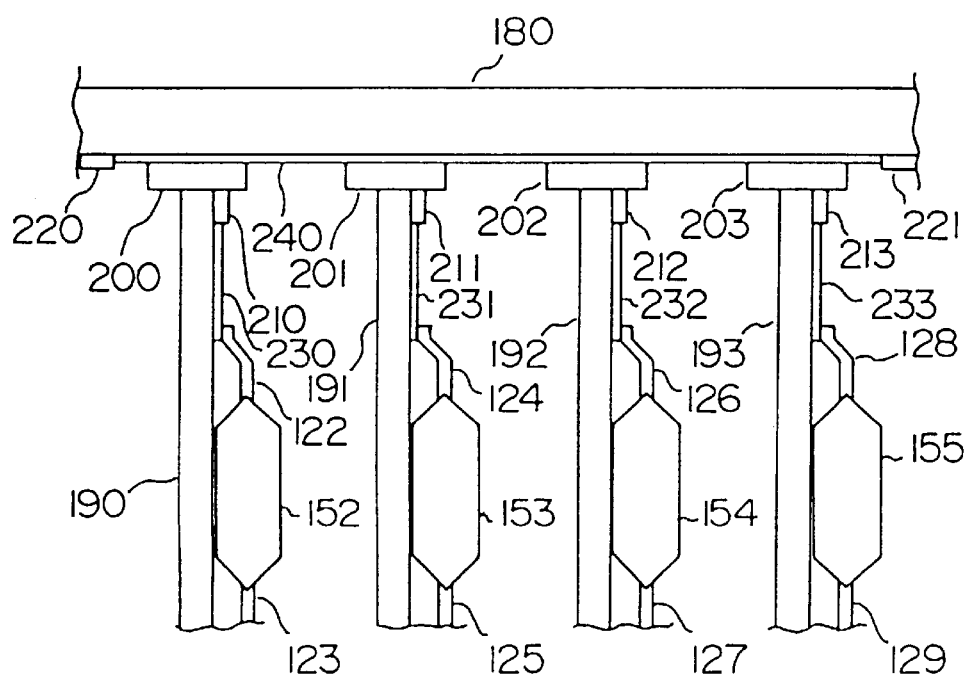
FIG. 30 is a diagram showing an example of a device on which the QFP package is mounted.

FIG. 30 shows a model on which the QFP package of FIG. 28 is mounted. The model of FIG. 30 is arranged so that four boards 190 to 193 are mounted on a mother board 180 through connectors 200 to 203. As the corresponding portions to those shown in FIG. 27, the transmission lines 11 to 14 correspond to transmission lines 230 to 233, the matching resistors 80 to 83 correspond to matching resistors 210 to 213. The inter-circuit block transmission line 100 corresponds to a data bus 240. The terminating resistors 50, 51 correspond to terminating resistors 220, 221. In addition, in FIG. 30, the transmission lines 230 to 233 run on the outer layer of the board. On the other hand, those lines may be formed on the inner layer. In the arrangement shown in FIG. 30, the number of boards to be mounted is not limited. Further, a similar circuit may be composed on just one board without the mother board.

According to the present embodiment, for matching the impedances with each other, the components having larger packaging capacitance and inductance such as a logic LSI are more effective.

In this embodiment, each inner circuit block has just one driving circuit or receiving circuit. Like the embodiment 2, on the other hand, one inner circuit block may have both of the driving circuit and the receiving circuit.

The present invention offers new ideas in light of the method of designing or manufacturing an integrated circuit such as an IC or an LSI or a module such as a memory. Previously, the process of designing or manufacturing such devices, the impedance of a transmission line on the board to be mounted has not been considered at all. According to the present invention, in the process of designing or manufacturing such devices, the following new designing and manufacturing process is taken:

(1) Define an impedance of a transmission line of a board to be mounted.

(2) Define an impedance of a transmission line on a board on which a transmission line such as a lead frame for an integrated circuit to be designed is to be connected. (Define an impedance on each lead frame. If the transmission line on the board is constant, follow it.)

(3) The transmission bus is manufactured according to the impedance of the designed transmission and then is connected to an integrated circuit chip by using a wire-bonding technique, for example.

(4) Mount the transmission line on the right place of the board.

Based on this manufacturing method, it is possible to manufacture an integrated circuit or a signal transmitting circuit which is suitable to fast transmission.

It is to be understood that the above-described arrangements are simply illustrative of the application of the principles of the present invention. Numerous other arrangements may be readily devised by those skilled in the art which will embody the principles of the invention and fall within its spirit and scope.

What is claimed is:

1. A signal transmitting device comprising:
   a main transmission line terminated at one end or both ends thereof;
   a driving circuit for driving a signal;
   a first stubline for transmitting the signal output from said driving circuit to said main transmission line;
   a first resistor inserted between said main transmission line and said first stubline, said first resistor having a resistance value to provide impedance matching between the main transmission line and the first stubline to suppress reflections at a branch point between the main transmission line and the first stubline;
   a receiving circuit for receiving a signal;
   a second stubline for transmitting the signal from said main transmission line to said receiving circuit; and
   a second resistor inserted between said main transmission line and said second stubline, said second resistor having a resistance value to provide impedance matching between the main transmission line and the second stubline to suppress reflections at a branch point between the main transmission line and the second stubline.

2. A signal transmitting device according to claim 1, wherein the impedance of said second stubline is higher than the impedance of said main transmission line.

3. A signal transmitting device according to claim 1, wherein said first resistor has a resistance substantially equal to a value derived by subtracting a half of an impedance of said main transmission line from a predetermined impedance of said first stubline, and wherein said second resistor has a resistance substantially equal to a value derived by subtracting a half of an impedance of said main transmission line from a predetermined impedance of said second stubline.

4. A signal transmitting device according to claim 1, wherein said driving circuit includes an output circuit of a push-pull type for driving a signal.

5. A signal transmitting device according to claim 1, wherein said receiving circuit includes a differential input circuit for receiving a signal.

6. A signal transmitting device according to claim 1, wherein the impedance of said first stubline is higher than the impedance of said main transmission line.

7. A signal transmitting device according to claim 2, wherein the impedance of said first stubline is higher than the impedance of said main transmission line.

* * * * *

UNITED STATES PATENT AND TRADEMARK OFFICE
CERTIFICATE OF CORRECTION

| | |
|---|---|
| PATENT NO. | : 6,172,517 B1 |
| APPLICATION NO. | : 09/084017 |
| DATED | : January 9, 2001 |
| INVENTOR(S) | : T. Takekuma et al. |

Page 1 of 1

It is certified that error appears in the above-identified patent and that said Letters Patent is hereby corrected as shown below:

Item (63): please delete the entire paragraph; and replace it with the following:
CROSS-REFERENCE TO RELATED APPLICATIONS Continuation of application Ser. No. 08/773,753, filed Dec. 24, 1996 (now U.S. Pat. No. 5,818,253); which is a Continuation of application Ser. No. 08/596,724, filed Feb. 5, 1996 (now U.S. Pat. No. 5,627,481); which is a Continuation of application Ser. No. 08/269,352, filed Jun. 30, 1994 (now U.S. Pat. No. 5,548,226).

Signed and Sealed this

Fifth Day of October, 2010

David J. Kappos
*Director of the United States Patent and Trademark Office*